(12) United States Patent
Li

(10) Patent No.: US 11,461,173 B1
(45) Date of Patent: Oct. 4, 2022

(54) METHOD AND SYSTEM FOR FACILITATING EFFICIENT DATA COMPRESSION BASED ON ERROR CORRECTION CODE AND REORGANIZATION OF DATA PLACEMENT

(71) Applicant: Alibaba Singapore Holding Private Limited, Singapore (SG)

(72) Inventor: Shu Li, Bothell, WA (US)

(73) Assignee: ALIBABA SINGAPORE HOLDING PRIVATE LIMITED, Singapore (SG)

(*) Notice: Subject to any disclaimer, the term of this patent is extended or adjusted under 35 U.S.C. 154(b) by 0 days.

(21) Appl. No.: 17/236,526

(22) Filed: Apr. 21, 2021

(51) Int. Cl.
*G11C 29/00* (2006.01)
*G06F 11/10* (2006.01)
*H03M 13/00* (2006.01)
*G06F 12/10* (2016.01)

(52) U.S. Cl.
CPC .......... *G06F 11/1068* (2013.01); *G06F 12/10* (2013.01); *H03M 13/616* (2013.01); *H03M 13/6312* (2013.01)

(58) Field of Classification Search
CPC ................ G06F 11/1068; G06F 12/10; H03M 13/6312; H03M 13/616
See application file for complete search history.

(56) References Cited

U.S. PATENT DOCUMENTS

| | | | |
|---|---|---|---|
| 3,893,071 A | 7/1975 | Bossen | |
| 4,562,494 A | 12/1985 | Bond | |
| 4,718,067 A | 1/1988 | Peters | |
| 4,775,932 A | 10/1988 | Oxley | |
| 4,858,040 A | 8/1989 | Hazebrouck | |

(Continued)

FOREIGN PATENT DOCUMENTS

| | | |
|---|---|---|
| JP | 2003022209 | 1/2003 |
| JP | 2011175422 | 9/2011 |

(Continued)

OTHER PUBLICATIONS https://web.archive.org/web/20071130235034/http://en.wikipedia.org:80/wiki/logical_block_addressing wikipedia screen shot retriefed on wayback Nov. 20, 2007 showing both physical and logical addressing used historically to access data on storage devices (Year: 2007).

(Continued)

*Primary Examiner* — Samir W Rizk
(74) *Attorney, Agent, or Firm* — Shun Yao; Yao Legal Services, Inc.

(57) ABSTRACT

One embodiment provides a system which facilitates data management. During operation, the system receives, by a storage device, a plurality of data blocks. The system compresses the data blocks to obtain compressed data blocks, and performs error correction code (ECC)-encoding on the compressed data blocks to obtain ECC-encoded data blocks. The system stores the ECC-encoded data blocks in a buffer prior to writing the ECC-encoded data blocks in a non-volatile memory of the storage device, and reorganizes an order of the ECC-encoded data blocks in the buffer to match a size of a physical page of the non-volatile memory. Responsive to a first set of the reorganized ECC-encoded data blocks filling a first physical page, the system writes the first set of the reorganized ECC-encoded data blocks to the first physical page.

15 Claims, 10 Drawing Sheets

(56) References Cited

U.S. PATENT DOCUMENTS

| | | |
|---|---|---|
| 5,394,382 A | 2/1995 | Hu |
| 5,602,693 A | 2/1997 | Brunnett |
| 5,715,471 A | 2/1998 | Otsuka |
| 5,732,093 A | 3/1998 | Huang |
| 5,802,551 A | 9/1998 | Komatsu |
| 5,930,167 A | 7/1999 | Lee |
| 6,098,185 A | 8/2000 | Wilson |
| 6,148,377 A | 11/2000 | Carter |
| 6,226,650 B1 | 5/2001 | Mahajan et al. |
| 6,243,795 B1 | 6/2001 | Yang |
| 6,457,104 B1 | 9/2002 | Tremaine |
| 6,658,478 B1 | 12/2003 | Singhal |
| 6,795,894 B1 | 9/2004 | Neufeld |
| 7,351,072 B2 | 4/2008 | Muff |
| 7,565,454 B2 | 7/2009 | Zuberi |
| 7,599,139 B1 | 10/2009 | Bombet |
| 7,953,899 B1 | 5/2011 | Hooper |
| 7,958,433 B1 | 6/2011 | Yoon |
| 8,085,569 B2 | 12/2011 | Kim |
| 8,144,512 B2 | 3/2012 | Huang |
| 8,166,233 B2 | 4/2012 | Schibilla |
| 8,260,924 B2 | 9/2012 | Koretz |
| 8,281,061 B2 | 10/2012 | Radke |
| 8,452,819 B1 | 5/2013 | Sorenson, III |
| 8,516,284 B2 | 8/2013 | Chan |
| 8,527,544 B1 | 9/2013 | Colgrove |
| 8,751,763 B1 | 6/2014 | Ramarao |
| 8,819,367 B1 | 8/2014 | Fallone |
| 8,825,937 B2 | 9/2014 | Atkisson |
| 8,832,688 B2 | 9/2014 | Tang |
| 8,868,825 B1 | 10/2014 | Hayes |
| 8,904,061 B1 | 12/2014 | O'Brien, III |
| 8,949,208 B1 | 2/2015 | Xu |
| 9,015,561 B1 | 4/2015 | Hu |
| 9,031,296 B2 | 5/2015 | Kaempfer |
| 9,043,545 B2 | 5/2015 | Kimmel |
| 9,088,300 B1 | 7/2015 | Chen |
| 9,092,223 B1 | 7/2015 | Pani |
| 9,129,628 B1 | 9/2015 | Fallone |
| 9,141,176 B1 | 9/2015 | Chen |
| 9,208,817 B1 | 12/2015 | Li |
| 9,213,627 B2 | 12/2015 | Van Acht |
| 9,280,472 B1 | 3/2016 | Dang |
| 9,280,487 B2 | 3/2016 | Candelaria |
| 9,311,939 B1 | 4/2016 | Malina |
| 9,336,340 B1 | 5/2016 | Dong |
| 9,436,595 B1 | 9/2016 | Benitez |
| 9,495,263 B2 | 11/2016 | Pang |
| 9,529,601 B1 | 12/2016 | Dharmadhikari |
| 9,529,670 B2 | 12/2016 | O'Connor |
| 9,575,982 B1 | 2/2017 | Sankara Subramanian |
| 9,588,698 B1 | 3/2017 | Karamcheti |
| 9,588,977 B1 | 3/2017 | Wang |
| 9,607,631 B2 | 3/2017 | Rausch |
| 9,671,971 B2 | 6/2017 | Trika |
| 9,747,202 B1 | 8/2017 | Shaharabany |
| 9,852,076 B1 | 12/2017 | Garg |
| 9,875,053 B2 | 1/2018 | Frid |
| 9,912,530 B2 | 3/2018 | Singatwaria |
| 9,946,596 B2 | 4/2018 | Hashimoto |
| 10,013,169 B2 | 7/2018 | Fisher |
| 10,199,066 B1 | 2/2019 | Feldman |
| 10,229,735 B1 | 3/2019 | Natarajan |
| 10,235,198 B2 | 3/2019 | Qiu |
| 10,268,390 B2 | 4/2019 | Warfield |
| 10,318,467 B2 | 6/2019 | Barzik |
| 10,361,722 B2 | 7/2019 | Lee |
| 10,437,670 B1 | 10/2019 | Koltsidas |
| 10,459,663 B2 | 10/2019 | Agombar |
| 10,642,522 B2 | 5/2020 | Li |
| 10,649,657 B2 | 5/2020 | Zaidman |
| 10,678,432 B1 | 6/2020 | Dreier |
| 10,756,816 B1 | 8/2020 | Dreier |
| 10,928,847 B2 | 2/2021 | Suresh |
| 2001/0032324 A1 | 10/2001 | Slaughter |
| 2002/0010783 A1 | 1/2002 | Primak |
| 2002/0039260 A1 | 4/2002 | Kilmer |
| 2002/0073358 A1 | 6/2002 | Atkinson |
| 2002/0095403 A1 | 7/2002 | Chandrasekaran |
| 2002/0112085 A1 | 8/2002 | Berg |
| 2002/0161890 A1 | 10/2002 | Chen |
| 2003/0074319 A1 | 4/2003 | Jaquette |
| 2003/0145274 A1 | 7/2003 | Hwang |
| 2003/0163594 A1 | 8/2003 | Aasheim |
| 2003/0163633 A1 | 8/2003 | Aasheim |
| 2003/0217080 A1 | 11/2003 | White |
| 2004/0010545 A1 | 1/2004 | Pandya |
| 2004/0066741 A1 | 4/2004 | Dinker |
| 2004/0103238 A1 | 5/2004 | Avraham |
| 2004/0143718 A1 | 7/2004 | Chen |
| 2004/0255171 A1 | 12/2004 | Zimmer |
| 2004/0267752 A1 | 12/2004 | Wong |
| 2004/0268278 A1 | 12/2004 | Hoberman |
| 2005/0038954 A1 | 2/2005 | Saliba |
| 2005/0097126 A1 | 5/2005 | Cabrera |
| 2005/0138325 A1 | 6/2005 | Hofstee |
| 2005/0144358 A1 | 6/2005 | Conley |
| 2005/0149827 A1 | 7/2005 | Lambert |
| 2005/0174670 A1 | 8/2005 | Dunn |
| 2005/0177672 A1 | 8/2005 | Rao |
| 2005/0177755 A1 | 8/2005 | Fung |
| 2005/0195635 A1 | 9/2005 | Conley |
| 2005/0235067 A1 | 10/2005 | Creta |
| 2005/0235171 A1 | 10/2005 | Igari |
| 2006/0031709 A1 | 2/2006 | Hiraiwa |
| 2006/0101197 A1 | 5/2006 | Georgis |
| 2006/0156012 A1 | 7/2006 | Beeson |
| 2006/0184813 A1 | 8/2006 | Bui |
| 2007/0033323 A1 | 2/2007 | Gorobets |
| 2007/0061502 A1 | 3/2007 | Lasser |
| 2007/0101096 A1 | 5/2007 | Gorobets |
| 2007/0250756 A1 | 10/2007 | Gower |
| 2007/0266011 A1 | 11/2007 | Rohrs |
| 2007/0283081 A1 | 12/2007 | Lasser |
| 2007/0283104 A1 | 12/2007 | Wellwood |
| 2007/0285980 A1 | 12/2007 | Shimizu |
| 2008/0034154 A1 | 2/2008 | Lee |
| 2008/0065805 A1 | 3/2008 | Wu |
| 2008/0082731 A1 | 4/2008 | Karamcheti |
| 2008/0112238 A1 | 5/2008 | Kim |
| 2008/0163033 A1 | 7/2008 | Yim |
| 2008/0301532 A1 | 12/2008 | Uchikawa |
| 2009/0006667 A1 | 1/2009 | Lin |
| 2009/0089544 A1 | 4/2009 | Liu |
| 2009/0113219 A1 | 4/2009 | Aharonov |
| 2009/0125788 A1 | 5/2009 | Wheeler |
| 2009/0183052 A1 | 7/2009 | Kanno |
| 2009/0254705 A1 | 10/2009 | Abali |
| 2009/0282275 A1 | 11/2009 | Yermalayeu |
| 2009/0287956 A1 | 11/2009 | Flynn |
| 2009/0307249 A1 | 12/2009 | Koifman |
| 2009/0307426 A1 | 12/2009 | Galloway |
| 2009/0310412 A1 | 12/2009 | Jang |
| 2010/0031000 A1 | 2/2010 | Flynn |
| 2010/0169470 A1 | 7/2010 | Takashige |
| 2010/0217952 A1 | 8/2010 | Iyer |
| 2010/0229224 A1 | 9/2010 | Etchegoyen |
| 2010/0241848 A1 | 9/2010 | Smith |
| 2010/0321999 A1 | 12/2010 | Yoo |
| 2010/0325367 A1 | 12/2010 | Kornegay |
| 2010/0332922 A1 | 12/2010 | Chang |
| 2011/0031546 A1 | 2/2011 | Uenaka |
| 2011/0055458 A1 | 3/2011 | Kuehne |
| 2011/0055471 A1 | 3/2011 | Thatcher |
| 2011/0060722 A1 | 3/2011 | Li |
| 2011/0072204 A1 | 3/2011 | Chang |
| 2011/0099418 A1 | 4/2011 | Chen |
| 2011/0153903 A1 | 6/2011 | Hinkle |
| 2011/0161784 A1 | 6/2011 | Selinger |
| 2011/0191525 A1 | 8/2011 | Hsu |
| 2011/0218969 A1 | 9/2011 | Anglin |
| 2011/0231598 A1 | 9/2011 | Hatsuda |
| 2011/0239083 A1 | 9/2011 | Kanno |
| 2011/0252188 A1 | 10/2011 | Weingarten |

(56) References Cited

U.S. PATENT DOCUMENTS

| | | |
|---|---|---|
| 2011/0258514 A1 | 10/2011 | Lasser |
| 2011/0289263 A1 | 11/2011 | Mcwilliams |
| 2011/0289280 A1 | 11/2011 | Koseki |
| 2011/0292538 A1 | 12/2011 | Haga |
| 2011/0296411 A1 | 12/2011 | Tang |
| 2011/0299317 A1 | 12/2011 | Shaeffer |
| 2011/0302353 A1 | 12/2011 | Confalonieri |
| 2012/0017037 A1 | 1/2012 | Riddle |
| 2012/0039117 A1 | 2/2012 | Webb |
| 2012/0084523 A1 | 4/2012 | Littlefield |
| 2012/0089774 A1 | 4/2012 | Kelkar |
| 2012/0096330 A1 | 4/2012 | Przybylski |
| 2012/0117399 A1 | 5/2012 | Chan |
| 2012/0147021 A1 | 6/2012 | Cheng |
| 2012/0151253 A1 | 6/2012 | Horn |
| 2012/0159099 A1 | 6/2012 | Lindamood |
| 2012/0159289 A1 | 6/2012 | Piccirillo |
| 2012/0173792 A1 | 7/2012 | Lassa |
| 2012/0203958 A1 | 8/2012 | Jones |
| 2012/0210095 A1 | 8/2012 | Nellans |
| 2012/0233523 A1 | 9/2012 | Krishnamoorthy |
| 2012/0246392 A1 | 9/2012 | Cheon |
| 2012/0278579 A1 | 11/2012 | Goss |
| 2012/0284587 A1 | 11/2012 | Yu |
| 2012/0324312 A1 | 12/2012 | Moyer |
| 2012/0331207 A1 | 12/2012 | Lassa |
| 2013/0013880 A1 | 1/2013 | Tashiro |
| 2013/0016970 A1 | 1/2013 | Koka |
| 2013/0018852 A1 | 1/2013 | Barton |
| 2013/0024605 A1 | 1/2013 | Sharon |
| 2013/0054822 A1 | 2/2013 | Mordani |
| 2013/0061029 A1 | 3/2013 | Huff |
| 2013/0073798 A1 | 3/2013 | Kang |
| 2013/0080391 A1 | 3/2013 | Raichstein |
| 2013/0145085 A1 | 6/2013 | Yu |
| 2013/0145089 A1 | 6/2013 | Eleftheriou |
| 2013/0151759 A1 | 6/2013 | Shim |
| 2013/0159251 A1 | 6/2013 | Skrenta |
| 2013/0159723 A1 | 6/2013 | Brandt |
| 2013/0166820 A1 | 6/2013 | Batwara |
| 2013/0173845 A1 | 7/2013 | Aslam |
| 2013/0191601 A1 | 7/2013 | Peterson |
| 2013/0205183 A1 | 8/2013 | Fillingim |
| 2013/0219131 A1 | 8/2013 | Alexandron |
| 2013/0227347 A1 | 8/2013 | Cho |
| 2013/0238955 A1 | 9/2013 | D'Abreu |
| 2013/0254622 A1 | 9/2013 | Kanno |
| 2013/0318283 A1 | 11/2013 | Small |
| 2013/0318395 A1 | 11/2013 | Kalavade |
| 2013/0329492 A1 | 12/2013 | Yang |
| 2014/0006688 A1 | 1/2014 | Yu |
| 2014/0019650 A1 | 1/2014 | Li |
| 2014/0025638 A1 | 1/2014 | Hu |
| 2014/0082273 A1 | 3/2014 | Segev |
| 2014/0082412 A1 | 3/2014 | Matsumura |
| 2014/0095769 A1 | 4/2014 | Borkenhagen |
| 2014/0095827 A1 | 4/2014 | Wei |
| 2014/0108414 A1 | 4/2014 | Stillerman |
| 2014/0108891 A1 | 4/2014 | Strasser |
| 2014/0164447 A1 | 6/2014 | Tarafdar |
| 2014/0164879 A1 | 6/2014 | Tam |
| 2014/0181532 A1 | 6/2014 | Camp |
| 2014/0195564 A1 | 7/2014 | Talagala |
| 2014/0215129 A1 | 7/2014 | Kuzmin |
| 2014/0223079 A1 | 8/2014 | Zhang |
| 2014/0233950 A1 | 8/2014 | Luo |
| 2014/0250259 A1 | 9/2014 | Ke |
| 2014/0279927 A1 | 9/2014 | Constantinescu |
| 2014/0304452 A1 | 10/2014 | De La Iglesia |
| 2014/0310574 A1 | 10/2014 | Yu |
| 2014/0359229 A1 | 12/2014 | Cota-Robles |
| 2014/0365707 A1 | 12/2014 | Talagala |
| 2015/0019798 A1 | 1/2015 | Huang |
| 2015/0067436 A1* | 3/2015 | Hu ............... G06F 12/0238 714/758 |
| 2015/0082317 A1 | 3/2015 | You |
| 2015/0106556 A1 | 4/2015 | Yu |
| 2015/0106559 A1 | 4/2015 | Cho |
| 2015/0121031 A1 | 4/2015 | Feng |
| 2015/0142752 A1 | 5/2015 | Chennamsetty |
| 2015/0143030 A1 | 5/2015 | Gorobets |
| 2015/0199234 A1 | 7/2015 | Choi |
| 2015/0227316 A1 | 8/2015 | Warfield |
| 2015/0234845 A1 | 8/2015 | Moore |
| 2015/0269964 A1 | 9/2015 | Fallone |
| 2015/0277937 A1 | 10/2015 | Swanson |
| 2015/0286477 A1 | 10/2015 | Mathur |
| 2015/0294684 A1 | 10/2015 | Qjang |
| 2015/0301964 A1 | 10/2015 | Brinicombe |
| 2015/0304108 A1 | 10/2015 | Obukhov |
| 2015/0310916 A1 | 10/2015 | Leem |
| 2015/0317095 A1 | 11/2015 | Voigt |
| 2015/0341123 A1 | 11/2015 | Nagarajan |
| 2015/0347025 A1 | 12/2015 | Law |
| 2015/0363271 A1 | 12/2015 | Haustein |
| 2015/0363328 A1 | 12/2015 | Candelaria |
| 2015/0372597 A1 | 12/2015 | Luo |
| 2016/0014039 A1 | 1/2016 | Reddy |
| 2016/0026575 A1 | 1/2016 | Samanta |
| 2016/0041760 A1 | 2/2016 | Kuang |
| 2016/0048327 A1 | 2/2016 | Jayasena |
| 2016/0048341 A1 | 2/2016 | Constantinescu |
| 2016/0054922 A1 | 2/2016 | Awasthi |
| 2016/0062885 A1 | 3/2016 | Ryu |
| 2016/0077749 A1 | 3/2016 | Ravimohan |
| 2016/0077764 A1 | 3/2016 | Ori |
| 2016/0077968 A1 | 3/2016 | Sela |
| 2016/0098344 A1 | 4/2016 | Gorobets |
| 2016/0098350 A1 | 4/2016 | Tang |
| 2016/0103631 A1 | 4/2016 | Ke |
| 2016/0110254 A1 | 4/2016 | Cronie |
| 2016/0132237 A1 | 5/2016 | Jeong |
| 2016/0154601 A1 | 6/2016 | Chen |
| 2016/0155750 A1 | 6/2016 | Yasuda |
| 2016/0162187 A1 | 6/2016 | Lee |
| 2016/0179399 A1 | 6/2016 | Melik-Martirosian |
| 2016/0188223 A1 | 6/2016 | Camp |
| 2016/0188890 A1 | 6/2016 | Naeimi |
| 2016/0203000 A1 | 7/2016 | Parmar |
| 2016/0224267 A1 | 8/2016 | Yang |
| 2016/0232103 A1 | 8/2016 | Schmisseur |
| 2016/0234297 A1 | 8/2016 | Ambach |
| 2016/0239074 A1 | 8/2016 | Lee |
| 2016/0239380 A1 | 8/2016 | Wideman |
| 2016/0274636 A1 | 9/2016 | Kim |
| 2016/0306699 A1 | 10/2016 | Resch |
| 2016/0306853 A1 | 10/2016 | Sabaa |
| 2016/0321002 A1 | 11/2016 | Jung |
| 2016/0335085 A1 | 11/2016 | Scalabrino |
| 2016/0342345 A1 | 11/2016 | Kankani |
| 2016/0343429 A1 | 11/2016 | Nieuwejaar |
| 2016/0350002 A1 | 12/2016 | Vergis |
| 2016/0350385 A1 | 12/2016 | Poder |
| 2016/0364146 A1 | 12/2016 | Kuttner |
| 2016/0381442 A1 | 12/2016 | Heanue |
| 2017/0004037 A1 | 1/2017 | Park |
| 2017/0010652 A1 | 1/2017 | Huang |
| 2017/0075583 A1 | 3/2017 | Alexander |
| 2017/0075594 A1 | 3/2017 | Badam |
| 2017/0091110 A1 | 3/2017 | Ash |
| 2017/0109199 A1 | 4/2017 | Chen |
| 2017/0109232 A1 | 4/2017 | Cha |
| 2017/0123655 A1 | 5/2017 | Sinclair |
| 2017/0147499 A1 | 5/2017 | Mohan |
| 2017/0161202 A1 | 6/2017 | Erez |
| 2017/0162235 A1 | 6/2017 | De |
| 2017/0168986 A1 | 6/2017 | Sajeepa |
| 2017/0177217 A1 | 6/2017 | Kanno |
| 2017/0177259 A1 | 6/2017 | Motwani |
| 2017/0185498 A1 | 6/2017 | Gao |
| 2017/0192848 A1 | 7/2017 | Pamies-Juarez |
| 2017/0199823 A1 | 7/2017 | Hayes |
| 2017/0212708 A1 | 7/2017 | Suhas |
| 2017/0220254 A1 | 8/2017 | Warfield |

(56) References Cited

U.S. PATENT DOCUMENTS

| | | |
|---|---|---|
| 2017/0221519 A1 | 8/2017 | Matsuo |
| 2017/0228157 A1 | 8/2017 | Yang |
| 2017/0242722 A1 | 8/2017 | Qiu |
| 2017/0249162 A1 | 8/2017 | Tsirkin |
| 2017/0262176 A1 | 9/2017 | Kanno |
| 2017/0262178 A1 | 9/2017 | Hashimoto |
| 2017/0262217 A1 | 9/2017 | Pradhan |
| 2017/0269998 A1 | 9/2017 | Sunwoo |
| 2017/0279460 A1 | 9/2017 | Camp |
| 2017/0285976 A1 | 10/2017 | Durham |
| 2017/0286311 A1 | 10/2017 | Juenemann |
| 2017/0322888 A1 | 11/2017 | Booth |
| 2017/0344470 A1 | 11/2017 | Yang |
| 2017/0344491 A1 | 11/2017 | Pandurangan |
| 2017/0353576 A1 | 12/2017 | Guim Bernat |
| 2018/0024772 A1 | 1/2018 | Madraswala |
| 2018/0024779 A1 | 1/2018 | Kojima |
| 2018/0033491 A1 | 2/2018 | Marelli |
| 2018/0052797 A1 | 2/2018 | Barzik |
| 2018/0067847 A1 | 3/2018 | Oh |
| 2018/0069658 A1 | 3/2018 | Benisty |
| 2018/0074730 A1 | 3/2018 | Inoue |
| 2018/0076828 A1 | 3/2018 | Kanno |
| 2018/0088867 A1 | 3/2018 | Kaminaga |
| 2018/0107591 A1 | 4/2018 | Smith |
| 2018/0113631 A1 | 4/2018 | Zhang |
| 2018/0143780 A1 | 5/2018 | Cho |
| 2018/0150640 A1 | 5/2018 | Li |
| 2018/0165038 A1 | 6/2018 | Authement |
| 2018/0165169 A1 | 6/2018 | Camp |
| 2018/0165340 A1 | 6/2018 | Agarwal |
| 2018/0167268 A1 | 6/2018 | Liguori |
| 2018/0173620 A1 | 6/2018 | Cen |
| 2018/0188970 A1 | 7/2018 | Liu |
| 2018/0189175 A1 | 7/2018 | Ji |
| 2018/0189182 A1 | 7/2018 | Wang |
| 2018/0212951 A1 | 7/2018 | Goodrum |
| 2018/0219561 A1 | 8/2018 | Litsyn |
| 2018/0226124 A1 | 8/2018 | Perner |
| 2018/0232151 A1 | 8/2018 | Badam |
| 2018/0260148 A1 | 9/2018 | Klein |
| 2018/0270110 A1 | 9/2018 | Chugtu |
| 2018/0293014 A1 | 10/2018 | Ravimohan |
| 2018/0300203 A1 | 10/2018 | Kathpal |
| 2018/0321864 A1 | 11/2018 | Benisty |
| 2018/0322024 A1 | 11/2018 | Nagao |
| 2018/0329776 A1 | 11/2018 | Lai |
| 2018/0336921 A1 | 11/2018 | Ryun |
| 2018/0349396 A1 | 12/2018 | Blagojevic |
| 2018/0356992 A1 | 12/2018 | Lamberts |
| 2018/0357126 A1 | 12/2018 | Dhuse |
| 2018/0373428 A1 | 12/2018 | Kan |
| 2018/0373655 A1 | 12/2018 | Liu |
| 2018/0373664 A1 | 12/2018 | Vijayrao |
| 2019/0012111 A1 | 1/2019 | Li |
| 2019/0050312 A1* | 2/2019 | Li ................. G06F 11/1044 |
| 2019/0050327 A1 | 2/2019 | Li |
| 2019/0065085 A1 | 2/2019 | Jean |
| 2019/0073261 A1 | 3/2019 | Halbert |
| 2019/0073262 A1 | 3/2019 | Chen |
| 2019/0087089 A1 | 3/2019 | Yoshida |
| 2019/0087115 A1 | 3/2019 | Li |
| 2019/0087328 A1 | 3/2019 | Kanno |
| 2019/0116127 A1 | 4/2019 | Pismenny |
| 2019/0171532 A1 | 6/2019 | Abadi |
| 2019/0172820 A1 | 6/2019 | Meyers |
| 2019/0196748 A1 | 6/2019 | Badam |
| 2019/0196907 A1 | 6/2019 | Khan |
| 2019/0205206 A1 | 7/2019 | Hornung |
| 2019/0212949 A1 | 7/2019 | Pletka |
| 2019/0220392 A1 | 7/2019 | Lin |
| 2019/0227927 A1 | 7/2019 | Miao |
| 2019/0272242 A1 | 9/2019 | Kachare |
| 2019/0278654 A1 | 9/2019 | Kaynak |
| 2019/0317901 A1 | 10/2019 | Kachare |
| 2019/0339998 A1 | 11/2019 | Momchilov |
| 2019/0377632 A1 | 12/2019 | Oh |
| 2019/0377821 A1 | 12/2019 | Pleshachkov |
| 2019/0391748 A1 | 12/2019 | Li |
| 2020/0004456 A1 | 1/2020 | Williams |
| 2020/0004674 A1 | 1/2020 | Williams |
| 2020/0013458 A1 | 1/2020 | Schreck |
| 2020/0042223 A1 | 2/2020 | Li |
| 2020/0042387 A1 | 2/2020 | Shani |
| 2020/0089430 A1 | 3/2020 | Kanno |
| 2020/0097189 A1 | 3/2020 | Tao |
| 2020/0143885 A1 | 5/2020 | Kim |
| 2020/0159425 A1 | 5/2020 | Flynn |
| 2020/0167091 A1 | 5/2020 | Haridas |
| 2020/0225875 A1 | 7/2020 | Oh |
| 2020/0242021 A1 | 7/2020 | Gholamipour |
| 2020/0250032 A1 | 8/2020 | Goyal |
| 2020/0257598 A1 | 8/2020 | Yazovitsky |
| 2020/0326855 A1 | 10/2020 | Wu |
| 2020/0328192 A1 | 10/2020 | Zaman |
| 2020/0348888 A1 | 11/2020 | Kim |
| 2020/0387327 A1 | 12/2020 | Hsieh |
| 2020/0401334 A1 | 12/2020 | Saxena |
| 2020/0409791 A1 | 12/2020 | Devriendt |
| 2021/0010338 A1 | 1/2021 | Santos |
| 2021/0089392 A1 | 3/2021 | Shirakawa |
| 2021/0103388 A1 | 4/2021 | Choi |

FOREIGN PATENT DOCUMENTS

| | | |
|---|---|---|
| WO | 9418634 | 8/1994 |
| WO | 1994018634 | 8/1994 |

OTHER PUBLICATIONS

Ivan Picoli, Carla Pasco, Bjorn Jonsson, Luc Bouganim, Philippe Bonnet. "uFLIP-OC: Understanding Flash I/O Patterns on Open-Channel Solid-State Drives." APSys'17, Sep. 2017, Mumbai, India, pp. 1-7, 2017, <10.1145/3124680.3124741>. <hal-01654985>.

EMC Powerpath Load Balancing and Failover Comparison with native MPIO operating system solutions. Feb. 2011.

Tsuchiya, Yoshihiro et al. "DBLK: Deduplication for Primary Block Storage", MSST 2011, Denver, CO, May 23-27, 2011 pp. 1-5.

Chen Feng, et al. "CAFTL: A Content-Aware Flash Translation Layer Enhancing the Lifespan of Flash Memory based Solid State Devices"< FAST'11, San Jose, CA Feb. 15-17, 2011, pp. 1-14.

Wu, Huijun et al. "HPDedup: A Hybrid Prioritized Data Deduplication Mechanism for Primary Storage in the Cloud", Cornell Univ. arXiv: 1702.08153v2[cs.DC], Apr. 16, 2017, pp. 1-14https://www.syncids.com/#.

WOW: Wise Ordering for Writes—Combining Spatial and Temporal Locality in Non-Volatile Caches by Gill (Year: 2005).

Helen H. W. Chan et al. "HashKV: Enabling Efficient Updated in KV Storage via Hashing", https://www.usenix.org/conference/atc18/presentation/chan, (Year: 2018).

S. Hong and D. Shin, "NAND Flash-Based Disk Cache Using SLC/MLC Combined Flash Memory," 2010 International Workshop on Storage Network Architecture and Parallel I/Os, Incline Village, NV, 2010, pp. 21-30.

Arpaci-Dusseau et al. "Operating Systems: Three Easy Pieces", Originally published 2015; Pertinent: Chapter 44; flash-based SSDs, available at http://pages.cs.wisc.edu/~remzi/OSTEP/.

Jimenex, X., Novo, D. and P. Ienne, "Pheonix:Reviving MLC Blocks as SLC to Extend NAND Flash Devices Lifetime,"Design, Automation & Text in Europe Conference & Exhibition (DATE), 2013.

Yang, T. Wu, H. and W. Sun, "GD-FTL: Improving the Performance and Lifetime of TLC SSD by Downgrading Worn-out Blocks," IEEE 37th International Performance Computing and Communications Conference (IPCCC), 2018.

C. Wu, D. Wu, H. Chou and C. Cheng, "Rethink the Design of Flash Translation Layers in a Component-Based View", in IEEE Acess, vol. 5, pp. 12895-12912, 2017.

(56) References Cited

OTHER PUBLICATIONS

Po-Liang Wu, Yuan-Hao Chang and T. Kuo, "A file-system-aware FTL design for flash-memory storage systems," 2009, pp. 393-398.
S. Choudhuri and T. Givargis, "Preformance improvement of block based NAND flash translation layer", 2007 5th IEEE/ACM/IFIP International Conference on Hardware/Software Codesign and Systems Synthesis (CODES+ISSS). Saizburg, 2007, pp. 257-262.
A. Zuck, O. Kishon and S. Toledo. "LSDM: Improving the Preformance of Mobile Storage with a Log-Structured Address Remapping Device Driver", 2014 Eighth International Conference on Next Generation Mobile Apps, Services and Technologies, Oxford, 2014, pp. 221-228.
J. Jung and Y. Won, "nvramdisk: A Transactional Block Device Driver for Non-Volatile RAM", in IEEE Transactions on Computers, vol. 65, No. 2, pp. 589-600, Feb. 1, 2016.
Te I et al. (Pensieve: a Machine Assisted SSD Layer for Extending the Lifetime: (Year: 2018).
ARM ("Cortex-R5 and Cortex-R5F", Technical reference Manual, Revision r1p1) (Year:2011).

\* cited by examiner

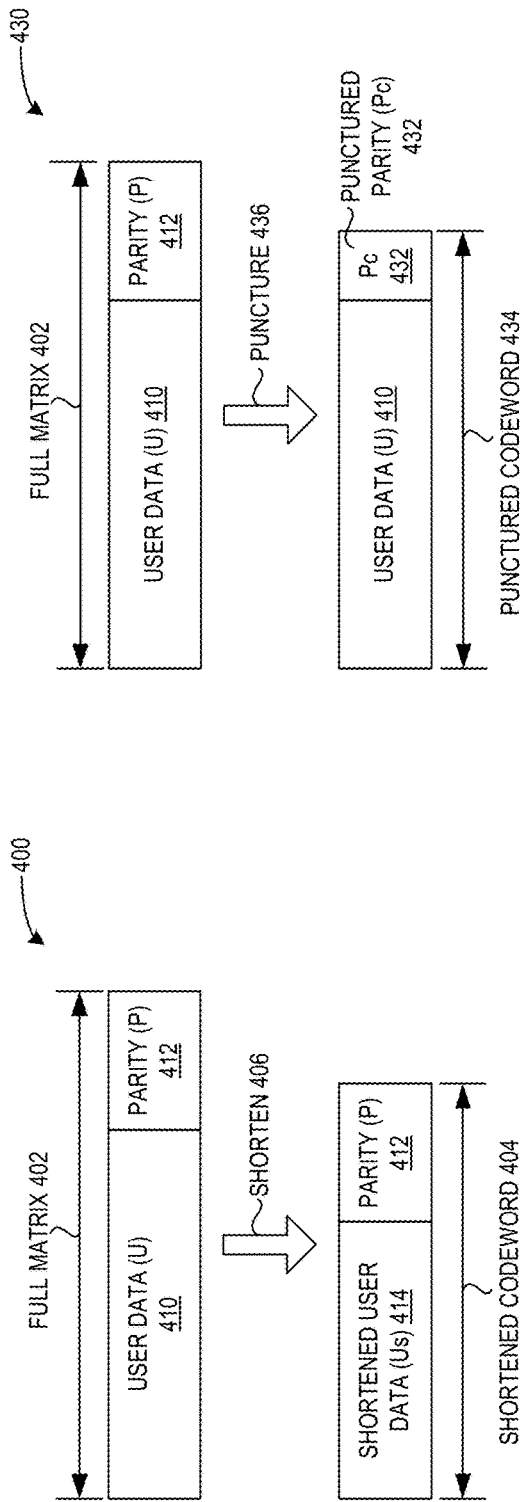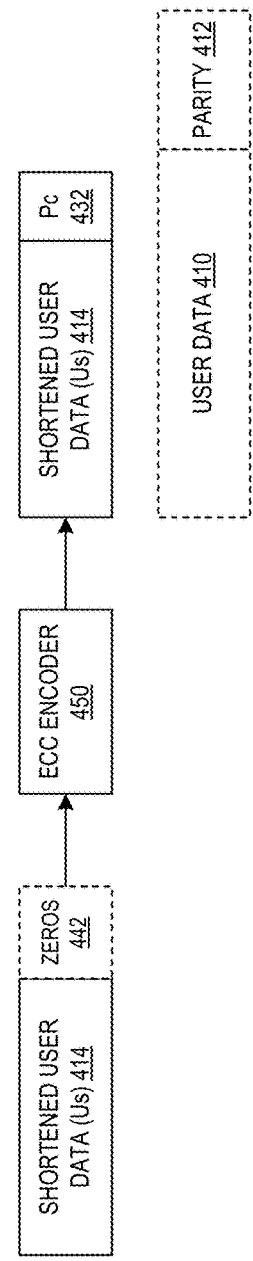
FIG. 4A
FIG. 4B
FIG. 4C

METHOD AND SYSTEM FOR FACILITATING EFFICIENT DATA COMPRESSION BASED ON ERROR CORRECTION CODE AND REORGANIZATION OF DATA PLACEMENT

BACKGROUND

Field

This disclosure is generally related to the field of data storage. More specifically, this disclosure is related to a method and system for facilitating efficient data compression based on error correction code encoding and reorganization of data placement.

Related Art

Today, various storage systems are being used to store and access the ever-increasing amount of digital content. A storage system can include storage servers with one or more storage devices or drives (such as a solid-state drive (SSD)). Data can be stored in a non-volatile storage media of an SSD, e.g., in Not-And flash (NAND) flash. Given the large amount of data to be processed and managed in a storage system, data compression is used increasingly in real-time applications. Because data compression can consume central processing unit (CPU) core resources and affect online performance, data compression is sometimes offloaded using hardware acceleration. As an example, one current approach to reduce access latency is for an application to send an original block of data to an SSD, where the SSD handles the data compression and metadata management. While this approach may make compression invisible to the host application, it can also result in a high burden to the SSD hardware and software.

One existing solution which addresses the burden to the SSD is to send data blocks to the SSD with their corresponding logical block addresses (LBAs). The SSD can perform compression on the data block and send the compressed block size to the flash translation layer (FTL), which can merge multiple compressed data blocks of varying sizes into a physical page of the NAND flash. The FTL can maintain mapping information between the logical address of the original data block and the compressed data stored at the physical address. After accumulating sufficient compressed data blocks to be programmed, the SSD can perform an error correction code (ECC)-encoding on fixed-length portions of user data. Due to the varying sizes of the multiple compressed data blocks, some data blocks may be in the same ECC codeword, while other data blocks may be split across two ECC codewords.

This existing solution is limited by the following constraints: the FTL mapping table must store more information due to the varying sizes of the multiple compressed data blocks; a compressed data block which is split across two ECC codewords requires two separate ECC decodings; when a requested data block is stored at a physical block address (PBA) shared by other compressed data blocks, the system must read and decode the other compressed data blocks, which can lead to read amplification; and when a requested data block covers two physical NAND pages, two separate read operations are required, which can result in a non-trivial impact on the access latency.

Thus, while moving data compression to the SSD can provide transparent compression to a host, some challenges remain which affect the efficiency and performance of the overall storage system.

SUMMARY

One embodiment provides a system which facilitates data management. During operation, the system receives, by a storage device, a plurality of data blocks. The system compresses the data blocks to obtain compressed data blocks, and performs error correction code (ECC)-encoding on the compressed data blocks to obtain ECC-encoded data blocks. The system stores the ECC-encoded data blocks in a buffer prior to writing the ECC-encoded data blocks in a non-volatile memory of the storage device, and reorganizes an order of the ECC-encoded data blocks in the buffer to match a size of a physical page of the non-volatile memory. Responsive to a first set of the reorganized ECC-encoded data blocks filling a first physical page, the system writes the first set of the reorganized ECC-encoded data blocks to the first physical page.

In some embodiments, the plurality of data blocks are associated with logical block addresses (LBAs). The system stores, in a data structure, a mapping between: a logical block address (LBA) for a respective ECC-encoded data block; a physical page address in the first physical page at which the respective ECC-encoded data block is written; and an index which indicates a location or offset for the respective ECC-encoded data block in the first physical page.

In some embodiments, the first set of the reorganized ECC-encoded data blocks written to the first physical page comprises: a header prepended to a respective ECC-encoded data block; and a tail appended to the respective ECC-encoded data block. The header and the tail comprise a repeated pattern which is based on the index for the respective ECC-encoded data block.

In some embodiments, the system performs ECC-encoding on a respective compressed data block to obtain a respective ECC-encoded data block by: reducing a size of a user portion which corresponds to a full parity check matrix to obtain a shortened user portion which corresponds to a size of the respective compressed data block; performing ECC-encoding on the shortened user portion appended by zeros to obtain parity bits; and puncturing the parity bits to obtain a punctured parity, wherein the respective obtained ECC-encoded data block comprises the shortened user portion and the punctured parity.

In some embodiments, the respective obtained ECC-encoded data block is written to the non-volatile memory as part of the first physical page. The system receives a request to read a data block in the first physical page from the non-volatile memory, wherein the requested data block comprises the respective obtained ECC-encoded data block written to the non-volatile memory. The system determines, based on a logical block address (LBA) associated with the requested data block, a physical page address (PPA) at which the requested data block is stored by searching a data structure which stores a mapping between the LBA, the PPA, and an index for the requested data block. The system retrieves the requested data block from the determined PPA based on the index. The system performs ECC-decoding on the retrieved data block, and returns the ECC-decoded data block to a requesting application.

In some embodiments, a parity check matrix for the requested data block comprises a plurality of circulants, wherein a respective circulant comprises an all-zero square matrix or a non-zero square matrix. A user portion of the parity check matrix corresponds to the shortened user portion of the requested data block appended with user-associated zeros, e.g., a sufficient number of appended user-associated zeros to meet a full size of the user portion of the parity check matrix. A parity portion of the parity check matrix corresponds to the punctured parity of the requested data block appended with parity-associated zeros, e.g., a sufficient number of appended parity-associated zeros to meet a full size of the parity portion of the parity check matrix. The user portion of the parity check matrix comprises one or more of: a first portion which includes full circulants and corresponds to the shortened user portion; a second portion which includes partial circulants and corresponds to both the shortened user portion and a first part of the appended user-associated zeros; and a third portion which includes full circulants and corresponds to a second part of the appended user-associated zeros. The parity portion of the parity check matrix comprises one or more of: a fourth portion which includes full circulants and corresponds to the punctured parity; and a fifth portion which includes full circulants and corresponds to the appended parity-associated zeros.

In some embodiments, performing ECC-decoding is based on: the first portion; the second portion and further based on a maximal confidence of the partial circulants which correspond to the second part of the appended user-associated zeroes; the fourth portion; and the fifth portion and further based on a minimal confidence of the full circulants which correspond to the appended parity-associated zeros.

In some embodiments, performing ECC-decoding is further based on bypassing the third portion based on a maximal confidence of all-zero circulants comprising the third portion.

BRIEF DESCRIPTION OF THE FIGURES

FIG. 4A illustrates an exemplary block diagram of an ECC encoding, including a shortened codeword, in accordance with an embodiment of the present application.

FIG. 4B illustrates an exemplary block diagram of an ECC encoding, including a punctured codeword, in accordance with an embodiment of the present application.

FIG. 4C illustrates an exemplary block diagram of an ECC encoding, corresponding to FIGS. 4A and 4B, in accordance with an embodiment of the present application.

In the figures, like reference numerals refer to the same figure elements.

DETAILED DESCRIPTION

Figure 1:
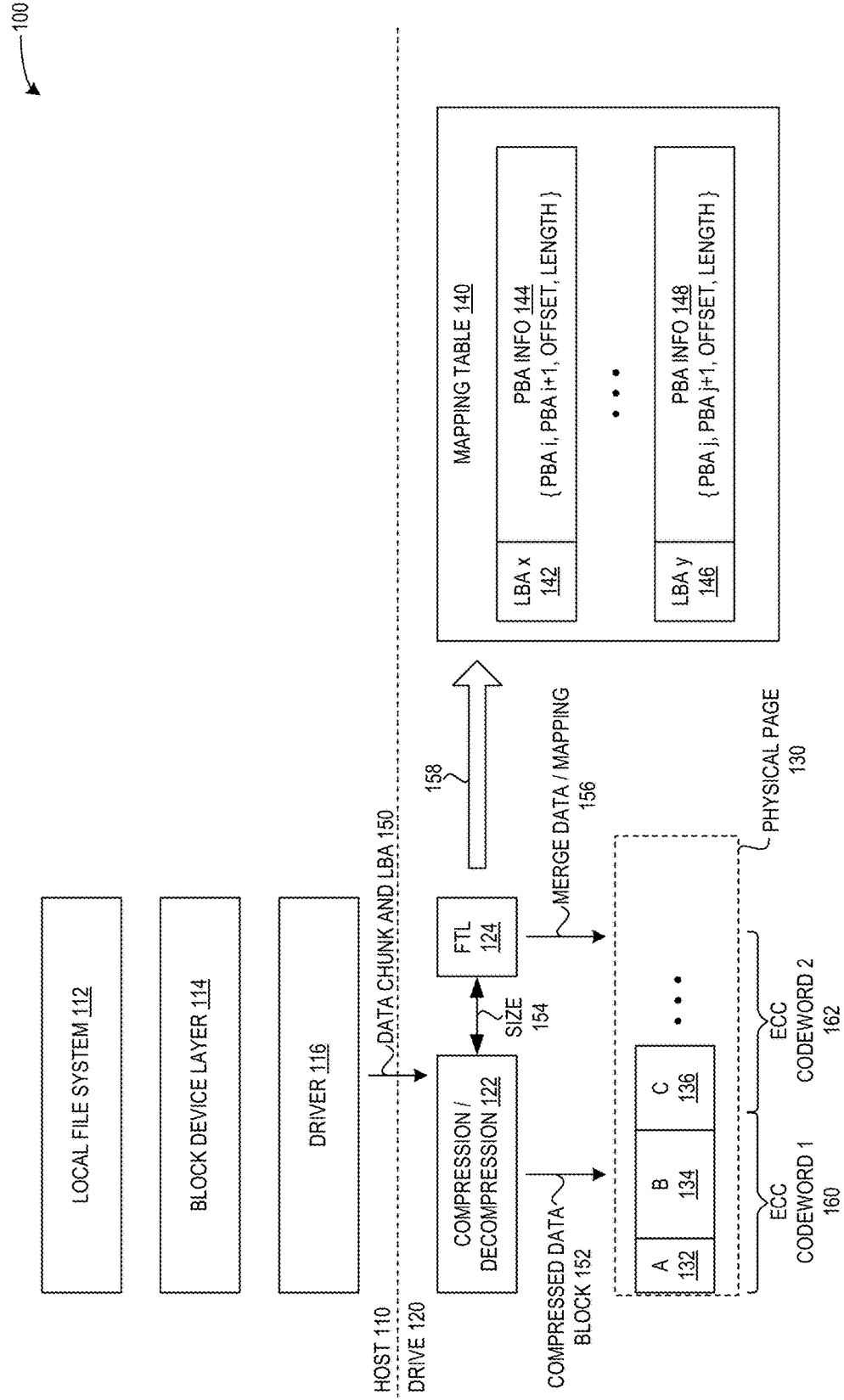
FIG. 1 illustrates an exemplary environment for facilitating data compression and placement, in accordance with the prior art.

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the embodiments described herein are not limited to the embodiments shown, but are to be accorded the widest scope consistent with the principles and features disclosed herein.

Overview

The embodiments described herein provide a system which facilitates efficient data compression based on error correction code (ECC)-encoding and reorganization of data placement.

As described above, given the large amount of data to be processed and managed in a storage system, data compression is used increasingly in real-time applications. Because data compression can consume CPU core resources and affect online performance, data compression is sometimes offloaded using hardware acceleration. One current approach to reduce the access latency is for an application to send an original block of data to an SSD, where the SSD handles the data compression and metadata management. While this approach may make compression invisible to the host application, it can also result in a high burden to the SSD hardware and software.

One existing solution which addresses the burden to the SSD is to send data blocks to the SSD with their corresponding logical block addresses (LBAs). The SSD can perform compression on the data block and send the compressed block size to the flash translation layer (FTL), which can merge multiple compressed data blocks of varying sizes into a physical page of the NAND flash. The FTL can maintain mapping information between the logical address of the original data block and the compressed data stored at the physical address. After accumulating sufficient compressed data blocks to be programmed, the SSD can perform an error correction code (ECC)-encoding on fixed-length portions of user data. Due to the varying sizes of the multiple compressed data blocks, some data blocks may be in the same ECC codeword, while other data blocks may be split across two ECC codewords. An exemplary prior art environment is described below in relation to FIG. 1.

This existing solution is limited by the following constraints: the FTL mapping table must store more information due to the varying sizes of the multiple compressed data blocks; a compressed data block which is split across two ECC codewords requires two separate ECC decodings; when a requested data block is stored at a PBA shared by other compressed data blocks, the system must read and decode the other compressed data blocks, which can lead to read amplification; and a requested data block which covers two physical NAND pages, two separate read operations are required, which can result in a non-trivial impact on the read latency. These constraints are described further below in relation to FIG. 1.

The embodiments described herein provide a system which addresses these constraints by compressing incoming data blocks, performing ECC-encoding on each of the data blocks to obtain ECC-encoded data blocks (of varying sizes), and reorganizing the varyingly sized ECC-encoded data blocks to fit into a single programming unit of the physical media, such as a physical page of NAND flash in an SSD. An exemplary environment which facilitates data compression, ECC-encoding, and data placement is described below in relation to FIG. 2.

The system can maintain a data structure (such as a mapping table) which stores a mapping between: an LBA for a respective ECC-encoded data block; a physical page address (PPA) in a physical page at which the respective ECC-encoded data block is stored; and an index which indicates a location or offset for the respective ECC-encoded data block in the physical page. An exemplary NAND page and mapping table is described below in relation to FIGS. 3A and 3B.

The system can also perform ECC-encoding based on the varyingly sized compressed data blocks, by generating a shortened user portion and a punctured parity, which results in consuming less storage space in the storage drive, as described below in relation to FIGS. 4A-4C. In addition, the system can perform ECC-decoding based on this ECC-encoding, as described below in relation to FIG. 5.

Thus, the described embodiments provide a system which can compress, encode, and place data of varying lengths in order to reduce access latency, mitigate read amplification, and improve the quality of service (QoS). By protecting each individual compressed data block with its own ECC capsule, and by using the mapping table and data placement reorganization (to fit into and fill a single physical NAND page), the system can achieve an improvement in the efficiency and performance of the storage drive and the overall storage system. The described embodiments thus solve the technological problem of improving the efficiency and performance of a storage system by providing a technological solution based on space adjustment, block isolation, and a simplified representation.

A "distributed storage system" or a "storage system" can include multiple storage servers. A "storage server" or a "storage system" can refer to a computing device which can include multiple storage devices or storage drives. A "storage device" or a "storage drive" refers to a device or a drive with a non-volatile memory which can provide persistent storage of data, e.g., a solid-state drive (SSD), or a flash-based storage device. A storage system can also be a computer system.

"Non-volatile memory" refers to storage media which may be used for persistent storage of data, e.g., flash memory of a NAND die of an SSD, magnetoresistive random access memory (MRAM), phase change memory (PCM), resistive random access memory (ReRAM), or another non-volatile memory.

"Volatile memory" refers to media which may be used to store data temporarily and in which power is required to maintain the stored data. Examples of volatile memory include DDR DRAM.

A "computing device" refers to any server, device, node, entity, drive, or any other entity which can provide any computing capabilities.

The term "read amplification" refers to the situation in which the size or granularity of requested data is smaller than the size or granularity of the overall returned or retrieved data (e.g., from a basic physical unit of NAND flash in a read operation).

Exemplary Environment for Data Compression and Placement in the Prior Art

FIG. 1 illustrates an exemplary environment 100 for facilitating data compression and placement, in accordance with the prior art. Environment 100 can include a host 110 and a (storage) drive 120. Host 110 can include a local file system 112, a block device layer 114, and a driver 116 (such as a non-volatile memory express (NVMe) driver). Drive 120 can include a compression/decompression module or engine 122, a flash translation layer (FTL) 124, and a mapping table 140. Drive 120 can also include data stored in physical media, e.g., in a physical page 130.

During operation, driver 116 can send a data block with its corresponding LBA (e.g., a data chunk and LBA 150). Compression engine 122 can compress the data block and generate a compressed data block 152 (e.g., A 132, B 134, C 136, etc.). Compression engine 122 can also send the size of the compressed block (e.g., a size 154) to FTL 124, which can merge multiple compressed data blocks into a physical page of the NAND flash (e.g., via a merge data/mapping 156 function into physical page 130).

FTL 124 can create and maintain mapping information between the logical address of the original data block and the physical address at which the compressed data is stored. The physical address can include information mapped to each LBA, such as the corresponding PBAs, an offset, and a length. This information can be stored in mapping table 140 (via a communication or operation 158). For example, mapping table 140 can store entries for each LBA, such as: an LBA x 142 which is mapped to PBA information 144 {PBA i, PBA i+1, offset, length}; and LBA y 146 which is mapped to PBA information 148 {PBA j, PBA j+1, offset, length}. Note that while only two PBAs are depicted as mapped to each of these exemplary LBAs, an LBA can be mapped to a greater or smaller number of PBAs than depicted in FIG. 1.

After the compressed data blocks (e.g., A 132, B 134, C 136, etc.) accumulate to a size of a programming unit of the NAND flash (e.g., the size of a physical page), the system (e.g., by an ECC encoder, not shown) can perform an ECC encoding on the compressed data blocks. The ECC encoder can perform the ECC encoding on fixed-length blocks of user data, which results in the merged data blocks being divided or cut into multiple parts during the ECC-encoding. Thus, multiple compressed data blocks may be in the same ECC codeword, and some data blocks may be divided across or into two different ECC codewords. For example, an ECC codeword 1 160 can be based on compressed data blocks A 132 and B 134, as well as part of compressed data block C 136, and an ECC codeword 2 can be based on a remaining portion of compressed data block C 136 and other compressed data blocks (not shown). Thus, compressed data blocks A 132 and B 134 are associated with the same ECC codeword 1 160, while compressed data block C 136 is divided across or associated with two different ECC codewords (ECC codeword 1 160 and ECC codeword 2 162). In addition, certain blocks may be spread or divided across or into two different NAND pages (e.g., at the start or the end of a NAND page).

As described above, the prior art environment of FIG. 1 is limited by certain constraints. First, due to the varying sizes of the multiple compressed data blocks, the FTL table must store a considerable amount of information, as shown in mapping table 140. For example, a compressed data block which has a variable length (e.g., spans two or more PBAs) can require much more information to be recorded as compared to the scenario where only one PBA is required to be stored. Second, a compressed data block which is split across two ECC codewords (e.g., compressed data block C 136 which is split across ECC codeword 1 160 and ECC codeword 2 162) can require two separate ECC decodings, which can consume the resources of drive 120 and thus negatively affect the quality of service (QoS). Third, when a requested data block is stored at a PBA which is shared by other compressed data blocks, the system must read and decode those other compressed data blocks, even though they are not part of the actual requested data. This can lead to a read amplification, which can reduce the read latency associated with the storage drive and with the overall storage system. Fourth, when a requested data block covers or spans two physical NAND pages, the system must perform two separate read operations, which can result in a non-trivial impact on the read latency, and can further result in a decreased performance and efficiency for the overall storage system.

Exemplary Environment for Multi-Stream Sequential Read Using Assigned Queues and LBA Comparator The embodiments described herein address the challenges associated with the prior art environment of FIG. 1 by providing a system which performs an optimization for compression in a storage drive, by using an ECC encoding and decoding (or "codec") module and reorganizing the placement of data.

Figure 2:
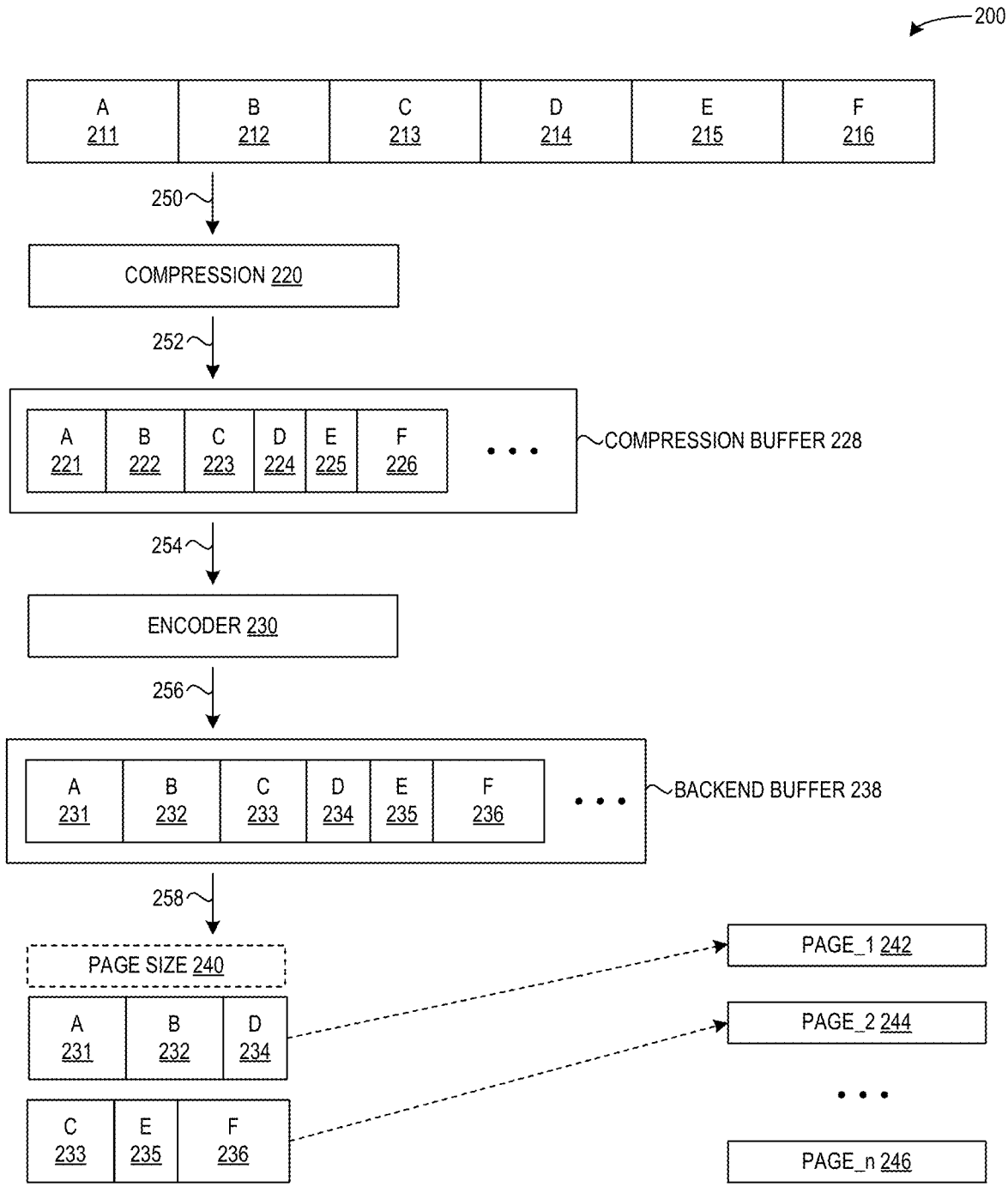
FIG. 2 illustrates an exemplary environment for facilitating data compression and placement, in accordance with an embodiment of the present application.

FIG. 2 illustrates an exemplary environment 200 for facilitating data compression and placement, in accordance with an embodiment of the present application. Environment 200 can include a plurality of data blocks A 211, B 212, C 213, D 214, E 215, and F 216. The system can receive these data blocks (via a communication 250), and, the system, via a compression module 220, can compress each of these data blocks and place the compressed data blocks in a compression buffer 228 (via a communication 252) as compressed data blocks A 221, B 222, C 223, D 224, E 225, and F 226.

Subsequently, an ECC encoder 230 can receive the compressed data blocks (via a communication 254), perform ECC-encoding on each data block, and place these compressed and ECC-encoded data blocks into a backend buffer 238 (via a communication 256) (referred to also as "ECC-encoded data blocks"). The ECC-encoded data blocks can include A 231, B 232, C 233, D 234, E 235, and F 236 (as shown in backend buffer 238). Note that compression buffer 228 and backend buffer 238 can be a volatile memory associated with a storage drive, such as a dynamic random access memory (DRAM) associated with an SSD. In some embodiments, buffers 228 and 238 may be stored on DRAM associated with a host or entity other than the storage drive or storage device.

Once these compressed and ECC-encoded data blocks are placed in backend buffer 238, the system can reorganize the order of the ECC-encoded data blocks to match the size of a programming unit of the physical media (e.g., a page size 240 of NAND flash memory). The system can perform this reordering based on the mapping of the logical addresses to the physical addresses. For example, the system can determine that ECC-encoded data block C 233 is too long to be stored together with ECC-encoded data blocks A 231 and B 232. Instead of splitting ECC-encoded data block C 233 across two different NAND pages (as in the prior art), the system can reorganize the blocks and place ECC-encoded data block D 234 (which is of a shorter length than ECC-encoded data block C 233) in the same page with A 231 and B 232 to match the page size by filling in the data as depicted.

When the system detects that a set of the reorganized ECC-encoded data blocks fill a physical page, the system can write the set of the ECC-encoded data blocks to the non-volatile memory. For example, the system can reorganize ECC-encoded data blocks A 231, B 232, and D 234 to fill a physical page, and write these data blocks to a page_1 242 of the non-volatile memory. Similarly, the system can reorganize ECC-encoded data blocks C 233, E 235, and F 236 to fill a physical page, and write these data blocks to a page_2 244 of the non-volatile memory.

Thus, in the embodiments described herein, the system performs ECC-encoding directly on each individual compressed data block, which avoids and eliminates splitting compressed data blocks across multiple ECC codewords. Furthermore, because compressed and ECC-encoded data blocks are stored in a same physical page, the FTL mapping table can store a reduced amount of information, as described below in relation to FIGS. 3A and 3B. These improvements can result in a reduced read latency, as well as an increase in the efficiency and performance of the storage drive and the overall storage system.

Exemplary NAND Page and Mapping Table

Figures 3A, 3B:
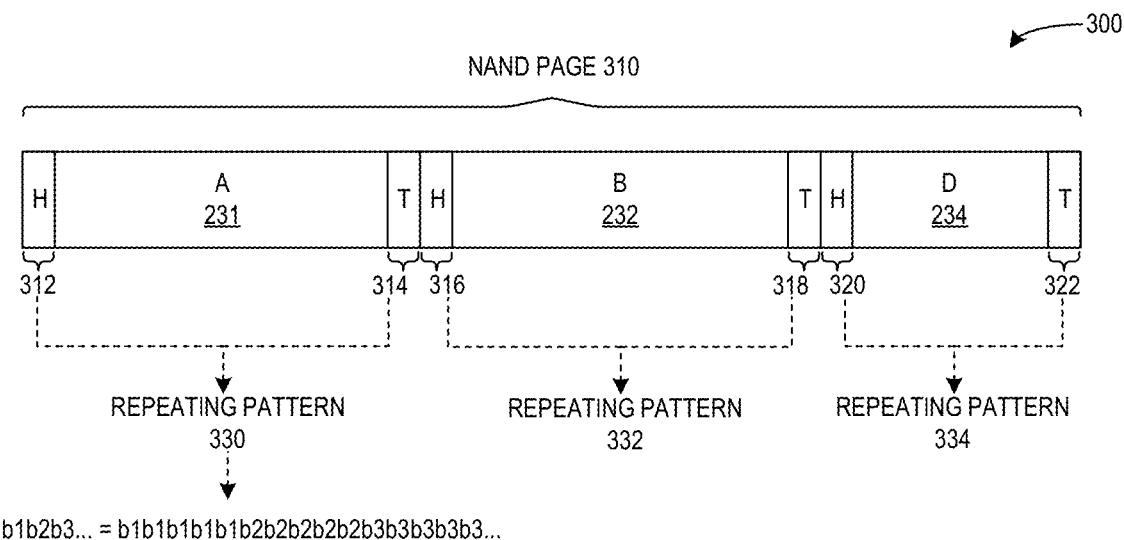
FIG. 3A illustrates an exemplary NAND page which stores compressed data blocks, in accordance with an embodiment of the present application.
FIG. 3B illustrates an exemplary table which maps LBAs to PPA and an index, in accordance with an embodiment of the present application.

FIG. 3A illustrates an exemplary NAND page 310 which stores compressed data blocks, in accordance with an embodiment of the present application. NAND page 310 can store three compressed and ECC-encoded data blocks (A 231, B 232, and D 234), as well as corresponding head and tail information for each of these data blocks. That is, each ECC-encoded data block can include: a head (H) prepended to the respective ECC-encoded data block; and a tail (T) appended to the respective ECC-encoded data block. The head and the tail can include a repeating pattern which is based on an index for the respective ECC-encoded block. The index can indicate a location or offset for the respective ECC-encoded data block within a given physical page, as depicted below in relation to FIG. 3B. For example, ECC-encoded data block A 231 can include a head 312 and a tail 314, which each have a same repeating pattern 330 of "b1b1b1b1b1b2b2b2b2b2b3b3b3b3b3," based off of an index value of "b1b2b3." Similarly, ECC-encoded data block B 232 can include a head 316 and a tail 318, which each have a same repeating pattern 332 (based off of a corresponding index value for ECC-encoded data block B 232). Finally, ECC-encoded data block D 234 can include a head 320 and a tail 322, which each have a same repeating pattern 334 (based off of a corresponding index value for ECC-encoded data block D 234).

FIG. 3B illustrates an exemplary table 340 which maps LBAs to PPA and an index, in accordance with an embodiment of the present application. Table 340 can be a data structure which is maintained by an FTL layer or module. Table 340 can include entries which indicate, in multiple columns for a respective ECC-encoded data block, a mapping between: an LBA 342 for the respective ECC-encoded data block; a physical page address (PPA) 344 at which the respective ECC-encoded data block is written; and an index

346 which indicates a location or offset for the respective ECC-encoded data block in the physical page.

For example, for ECC-encoded data block A 231 of NAND page 310, FTL mapping table can include an entry 350, which maps an LBA_A 352 to a PPA 354 and an index value of "000." Similarly, for ECC-encoded data block B 232 of NAND page 310, FTL mapping table 340 can include an entry 360, which maps an LBA_B 362 to a physical address, which can be indicated by a PPA 364 and an index value of "001." Based on the value of the index, the system can create the repeating pattern of the head and tail for a given ECC-encoded data block. For example, if one NAND page can store eight compressed and ECC-encoded data blocks, a 3-bit index can indicate the requested LBA which corresponds to data blocks stored at the PPA in an order from left to right. For ECC-encoded data block B 232, based on the index value of "001" in entry 360 of FTL mapping table 340, the system can create a repeating pattern of "000000000011111" for head 316 and tail 318 of ECC-encoded data block B 232 in NAND page 310. The system can repeat each bit an odd number of times, such as five or seven, or can use any basis for the repeating pattern.

ECC Encoding with Shortened User Data and Punctured Parity

Because the compressed data blocks may be of varying sizes, as depicted above in relation to FIG. 2, the system can implement ECC-encoding to handle user bits within a range of lengths. Given a respective compressed data block, the system can reduce a size of a user portion which corresponds to a full parity check matrix to obtain a shortened user portion which corresponds to a size of the respective compressed data block, as described below in relation to FIG. 4A. The system can perform an ECC encoding on the shortened user portion appended with or by zeros to obtain parity bits. The system can puncture the parity bits to obtain a punctured parity, as described below in relation to FIG. 4B. The system can write only the shortened user portion and the punctured parity to the non-volatile memory, as described below in relation to FIG. 4C. This can result in consuming a reduced amount of storage capacity for storing the data, which in turn can result in an increase in the available storage capacity as well as an increased efficiency and performance of the overall storage drive and storage system.

FIG. 4A illustrates an exemplary block diagram 400 of an ECC encoding, including a shortened codeword, in accordance with an embodiment of the present application. Diagram 400 depicts a conventional ECC codeword, including a user data (U) 410 portion and a parity (P) 412 portion, which corresponds to a full parity check matrix 402 (e.g., the size of a full parity check matrix). The system can shorten user data (U) 410 (via a shorten 406 operation), which can result in a shortened codeword 404, including a shortened user data (Us) 414 portion and the parity (P) 412 portion.

FIG. 4B illustrates an exemplary block diagram 430 of an ECC encoding, including a punctured codeword, in accordance with an embodiment of the present application. Diagram 430 depicts a conventional ECC codeword similar to diagram 400, including user data (U) 410 portion and a parity (P) 412 portion, which corresponds to the size of a full parity check matrix 402. The system can "puncture" parity (P) bits 412 (via a puncture 436 operation, e.g., by removing a portion of the generated parity bits of parity (P) 412). This can result in a punctured codeword 434, including user data (U) 410 and a punctured parity (Pc) portion 432.

When the user data (U) 410 (i.e., the compressed data bock) is shorter than the user submatrices of the full matrix, the system can chose the code with the closest approach. The ECC encoding can be based only on the user submatrix which is aligned with the incoming vector, since the remaining columns (corresponding to the appended zeros) are invalid and result in an equivalent zero effect. Shortened codeword 404 can thus maintain the same error correction strength as the full codeword (which is of the size of full matrix 402). The system can also puncture or remove a portion of the generated parity bits in order to reduce the ECC codeword to a size or a length which matches the variable lengths of incoming data blocks in one NAND page. The system may not use punctured codeword 434 if it is not necessary, because the puncture 436 operation may be considered as erasure coding which can also consume part of the capability and resources for error correction.

FIG. 4C illustrates an exemplary block diagram of an ECC encoding, corresponding to FIGS. 4A and 4B, in accordance with an embodiment of the present application. During operation, the system can generate shortened user data (Us) 414 (as depicted above in relation to FIG. 4A), and can append zeros 442 (e.g., "user-associated zeros") to shortened user data (Us) 414 to match the size of the user portion of a full parity check matrix. The system, by an ECC encoder 450, can perform ECC-encoding on shortened user data (Us) 414 appended with zeros, and can also puncture the generated and corresponding parity bits (as depicted above in relation to FIG. 4B) to obtain shortened user data (Us) 414 and punctured parity (Pc) 432, which the system can subsequently write as the respective compressed and ECC-encoded data block to the non-volatile memory. Note that the length or size of shortened user data (Us) 414 and punctured parity (Pc) 432 is less than or smaller than the length or size of the full parity check matrix, which is indicated by user data 410 and parity 412 with dashed border lines. Thus, diagrams 400, 430, and 440 depict how the described embodiments can result in consuming a reduced amount of storage capacity, which can result in an increased overall storage capacity, increased efficiency, and improved performance for the overall storage system.

ECC Decoding Corresponding to ECC Encoding

The system can perform ECC decoding based on the ECC encoding scheme depicted above in FIGS. 4A-4C. The ECC parity check matrix can include circulants which are either an all-zero square matrix or a non-zero square matrix with a dimension of Qc. Thus, the length of a full ECC codeword is a multiple of Qc, and the length of the user bits and the parity bits are also each a multiple of Qc. The circulants can be either full circulants (e.g., corresponding to data which is of the length of a full Qc) or partial circulants (e.g., corresponding to data which is a fraction of or only makes up a portion of a full circulant). A compressed data block is likely to include both full circulants and a partial or fractional circulant, in that the compressed data may not exactly match the length of a multiple of Qc. Thus, the shortened user bits can correspond to part of a full parity check matrix and can include two portions: a full-circulant portion; and a fractional-circulant portion. In general, the system can control the length of the punctured parity portion as a full-circulant portion, although the punctured parity may also include a fractional-circulant portion for sufficient flexibility. An exemplary ECC decoding is described below in relation to FIG. 5.

Figure 5:
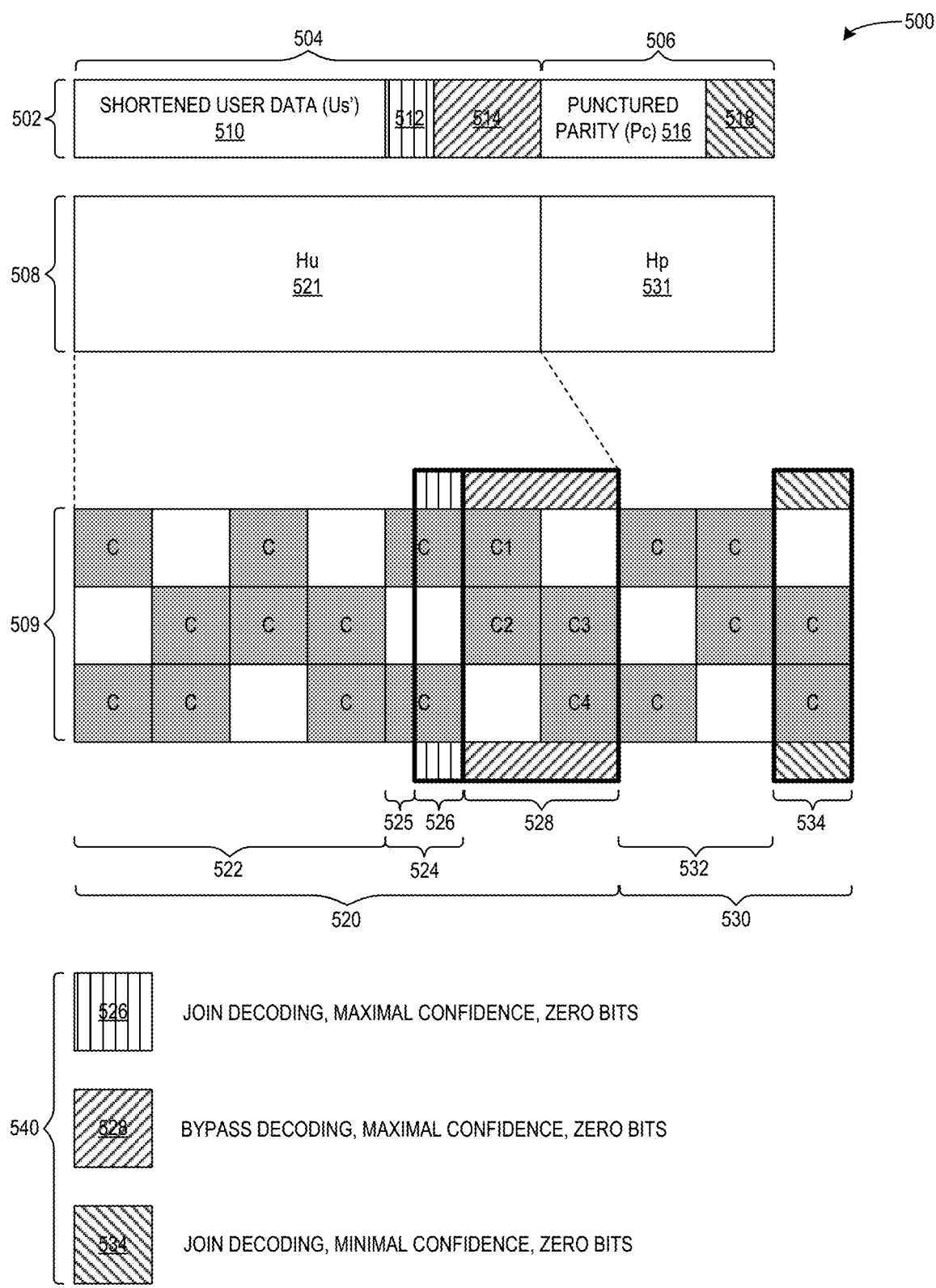
FIG. 5 illustrates an exemplary block diagram of an ECC decoding, in accordance with an embodiment of the present application.

FIG. 5 illustrates an exemplary block diagram 500 of an ECC decoding, in accordance with an embodiment of the present application. A full ECC codeword 502 can include a user portion 504 and a parity portion 506. User portion 504 can include: a shortened user data (Us') 510 portion; appended user-associated zeros 512 (depicted with vertical lines); and appended user-associated zeros 514 (depicted with right-slanting diagonal lines). Parity 506 portion can include: a punctured parity (Pc') 516 portion; and parity-associated zeros 518 (depicted with left-slanting diagonal lines).

A parity check matrix 508 can include a user portion Hu 521 of parity check matrix 508 and a parity portion Hp 531 of parity check matrix 508. A detailed view 509 of parity check matrix 508 can include non-zero circulants (indicated by a box with a solid shaded background and a "C") as well as all-zero circulants (indicated by a box with a white background without a "C"). Detailed view 509 of parity check matrix 508 can depict: a user portion 520 (corresponding to Hu 521) and a parity portion 530 (corresponding to Hp 531). User portion 520 can include: a first portion 522 which includes full circulants and corresponds to shortened user data (Us') 510; a second portion 524 which includes partial circulants and corresponds to both the shortened user portion (portion 525, corresponding to part of shortened user data (Us') 510) and part of the appended user-associated zeros (portion 526, depicted with vertical lines and corresponding to appended user-associated zeros 512); and a third portion 528 which includes full circulants and corresponds to appended user-associated zeros 514 (depicted with right-slanting diagonal lines). Parity portion 530 can include: a fourth portion 532 which includes full circulants and corresponds to punctured parity (Pc') 516; and a fifth portion 534 which includes full circulants and corresponds to appended parity-associated zeros 518 (depicted with left-slanting vertical lines).

During operation, the system can perform ECC-decoding based on: the first portion 522; and the second portion 524, further based on a maximal confidence of the partial circulants which correspond to the part (526) of the appended user-associated zeros; the fourth portion 532; and the fifth portion, further based on a minimal confidence of the full circulants which correspond to the appended parity-associated zeros (534). The system can thus bypass the third portion 528 based on a maximal confidence of the zero-square circulants comprising the third portion 528.

An index 540 can indicate three different scenarios for handling the zeros appended to the shortened user portion as well as the zeros appended as a result of puncturing the parity. In a first scenario, portion 528 (depicted with right-slanting diagonal lines) can bypass ECC-decoding with a maximal confidence based on the all-zero bits of the full circulants. In a second scenario, portion 534 (depicted with left-slanting diagonal lines) can join the ECC decoding with a minimal confidence, as the system does not know which bits of the parity were removed or punctured. The initial likelihood of a bit having a value of "0" is only 50% (or 0.5) probability, and there also exists a 50% (or 0.5) probability that the bit has a value of "1." In the iterations of ECC-decoding, the value of the bit may evolve until it reaches a value which satisfies the parity check matrix, regardless of whether the parity portion includes full circulants or partial circulants.

In a third scenario, portion 524 (including both data portion 525 and appended user-associated zeros portion 526) can join the ECC decoding. Because portion 526 includes all zeros which were appended to align the codeword size with the size of the full parity check matrix, the system can set the value of those bits to zero with a maximal confidence (e.g., that the likelihood of those bits being zero is 100% (or 1.0). The appended zeros only join the ECC decoding to assist the decoding to converge.

Exemplary Method for Facilitating a Multi-Stream Sequential Read

Figure 6A:
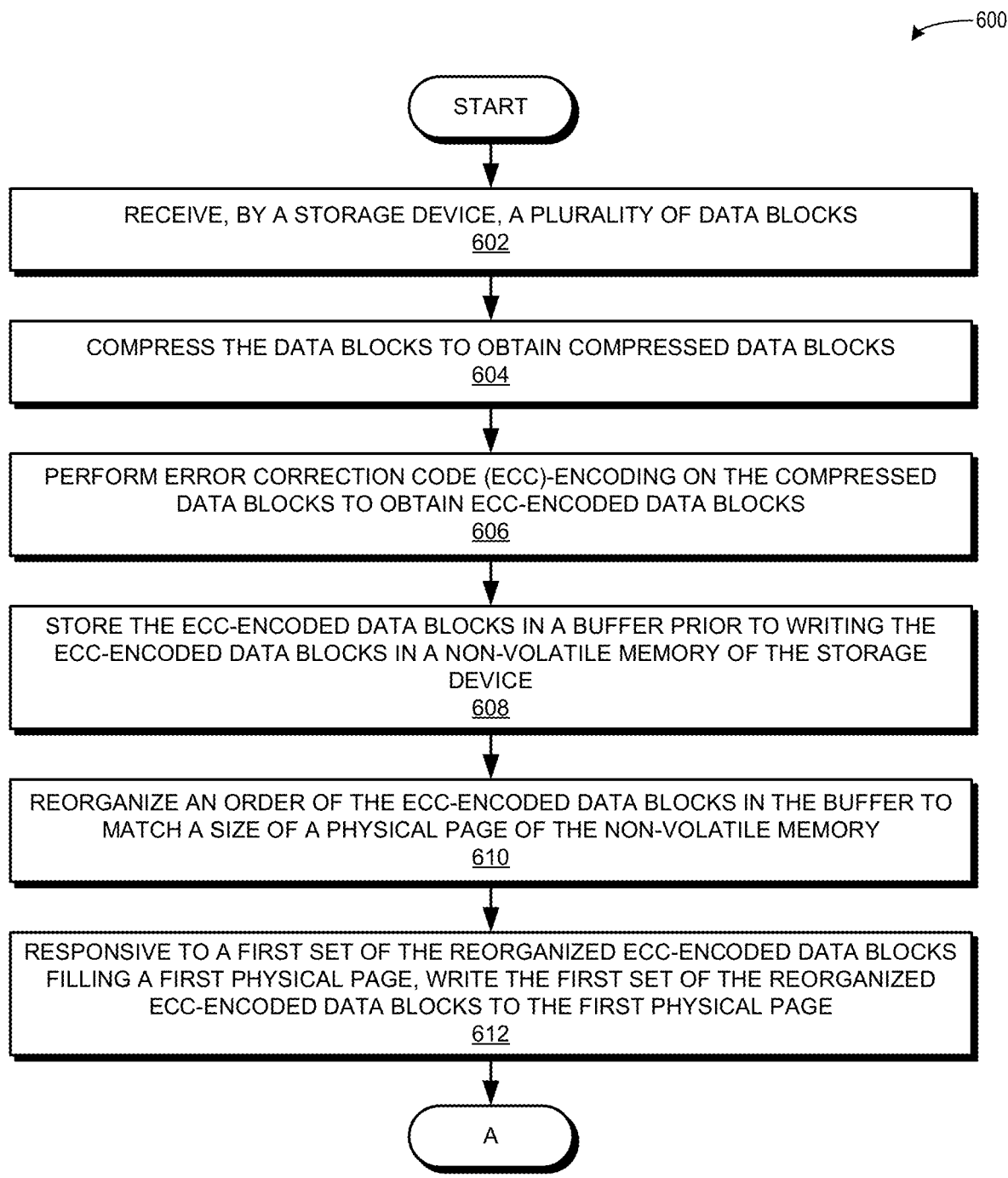
FIG. 6A presents a flowchart illustrating a method for facilitating data compression and placement, in accordance with an embodiment of the present application.

FIG. 6A presents a flowchart 600 illustrating a method for facilitating data compression and placement, in accordance with an embodiment of the present application. During operation, the system receives, by a storage device, a plurality of data blocks (operation 602). The system compresses the data blocks to obtain compressed data blocks (operation 604). The system performs error correction code (ECC)-encoding on the compressed data blocks to obtain ECC-encoded data blocks (operation 606). The system stores the ECC-encoded data blocks in a buffer prior to writing the ECC-encoded data blocks in a non-volatile memory of the storage device (operation 608). The system reorganizes an order of the ECC-encoded data blocks in the buffer to match a size of a physical page of the non-volatile memory (operation 610). Responsive to a first set of the reorganized ECC-encoded data blocks filling a first physical page, the system writes the first set of the reorganized ECC-encoded data blocks to the first physical page (operation 612). The operation continues at Label A of FIG. 6C.

Figure 6B:
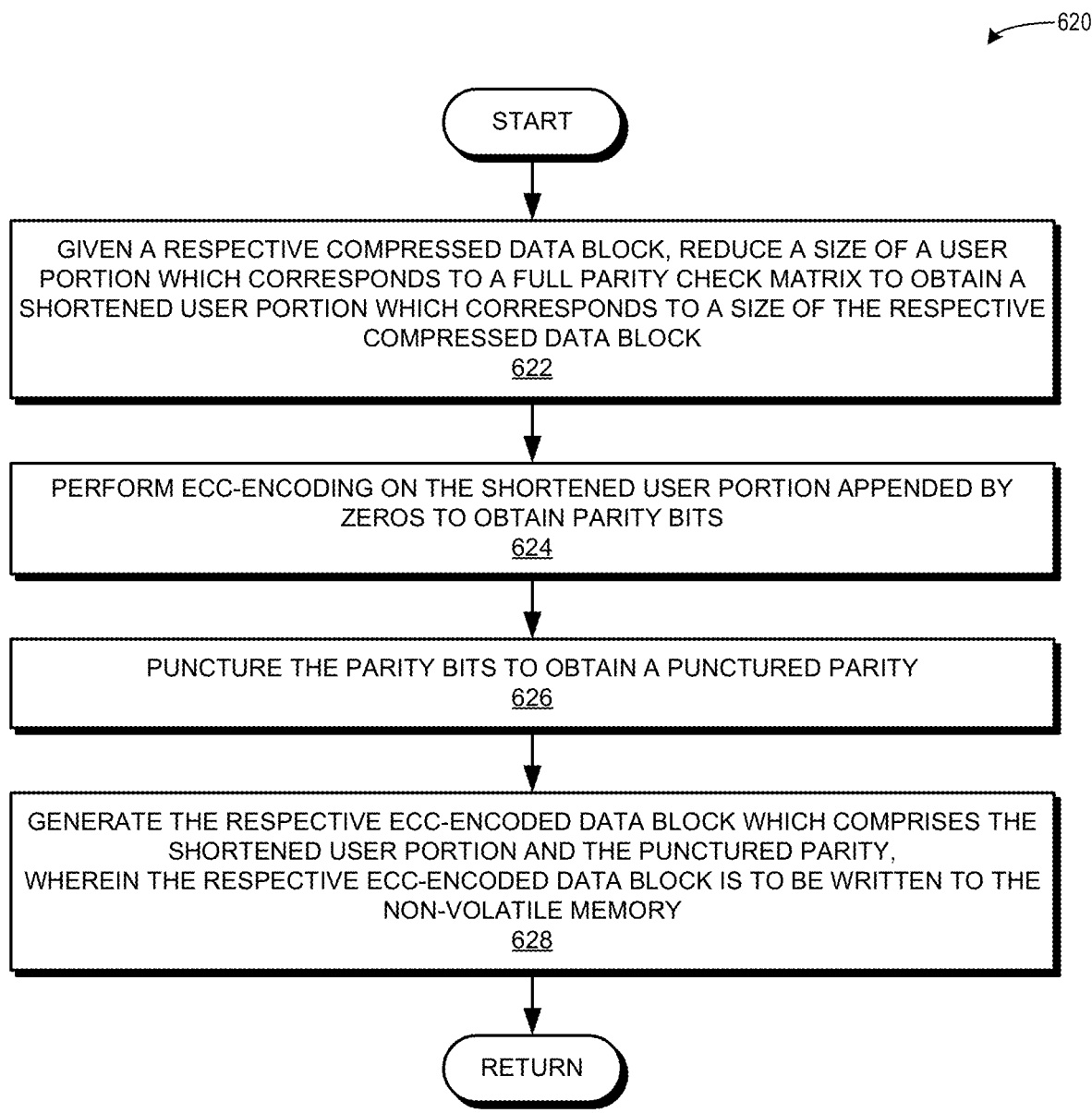
FIG. 6B presents a flowchart illustrating a method for facilitating data compression and placement, including ECC-encoding, in accordance with an embodiment of the present application.

FIG. 6B presents a flowchart 620 illustrating a method for facilitating data compression and placement, including ECC-encoding, in accordance with an embodiment of the present application. Flowchart 620 corresponds to the communications described above in relation to FIGS. 4A-4C. Given a respective compressed data block, the system reduces a size of a user portion which corresponds to a full parity check matrix to obtain a shortened user portion which corresponds to a size of the respective compressed data block (operation 622). The system performs ECC-encoding on the shortened user portion appended by zeros to obtain parity bits (operation 624). These "user-associated zeros" are appended so that the user portion meets the size of the user portion of the full parity check matrix. The system punctures the parity bits to obtain a punctured parity (operation 626). The system generates the respective ECC-encoded data block which comprises the shortened user portion and the punctured parity (operation 628).

Figure 6C:
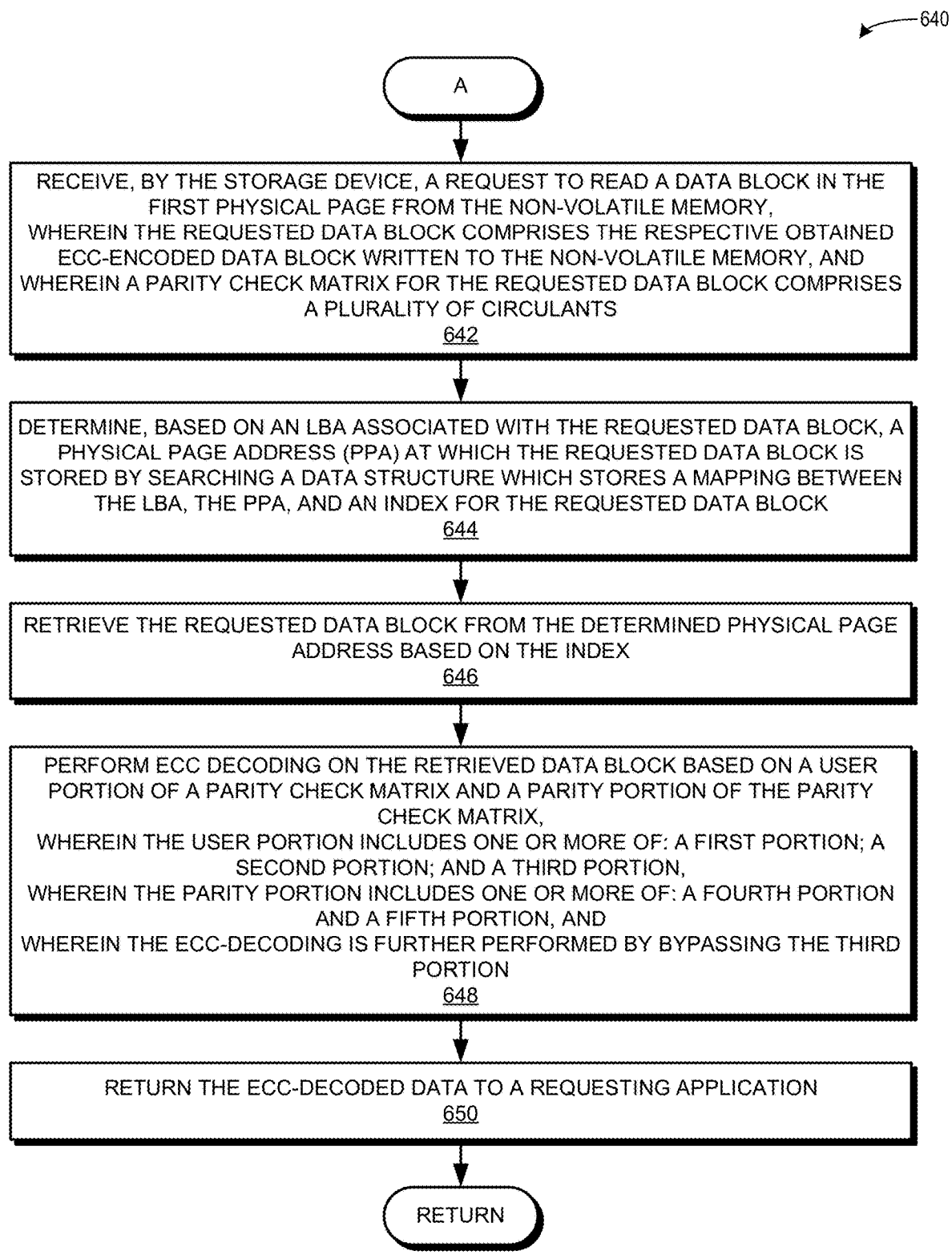
FIG. 6C presents a flowchart illustrating a method for facilitating data compression and placement, including ECC-decoding, in accordance with an embodiment of the present application.

FIG. 6C presents a flowchart 640 illustrating a method for facilitating data compression and placement, including ECC-decoding, in accordance with an embodiment of the present application. Flowchart 640 corresponds to the communications and operations described above in relation to FIG. 5. The system receives a request to read a data block in the first physical page from the non-volatile memory, wherein the requested data block comprises the respective obtained ECC-encoded data block written to the non-volatile memory, and wherein a parity check matrix for the requested data block comprises a plurality of circulants (operation 642). The system determines, based on an LBA associated with the requested data block, a physical page address at which the requested data block is stored by searching a data structure which stores a mapping between the LBA, the PPA, and an index for the requested data block (operation 644). The system retrieves the requested data block from the determined physical page address based on the index (operation 646) (e.g., as described above in relation to FIGS. 3A and 3B, including using the index in the data structure to determine and identify a corresponding repeating pattern in the header and tail of the respective ECC-encoded data block).

The system performs ECC-decoding on the retrieved data block based on a user portion of the parity check matrix and a parity portion of the parity check matrix, wherein the user portion includes one or more of: a first portion which includes full circulants and corresponds to the shortened user portion; a second portion which includes partial circulants and corresponds to both the shortened user portion and part of the appended user-associated zeros; and a third portion which includes full circulants and corresponds to the appended user-associated zeros, and wherein the parity portion includes one or more of: a fourth portion which includes full circulants and corresponds to the punctured parity; and a fifth portion which includes full circulants and corresponds to the appended parity-associated zeros (operation 648). Performing ECC-decoding on various portions of a retrieved data block is described above in relation to FIG. 5. The system returns the ECC-decoded data to a requesting application (operation 650).

Exemplary Computer System and Apparatus

Figure 7:
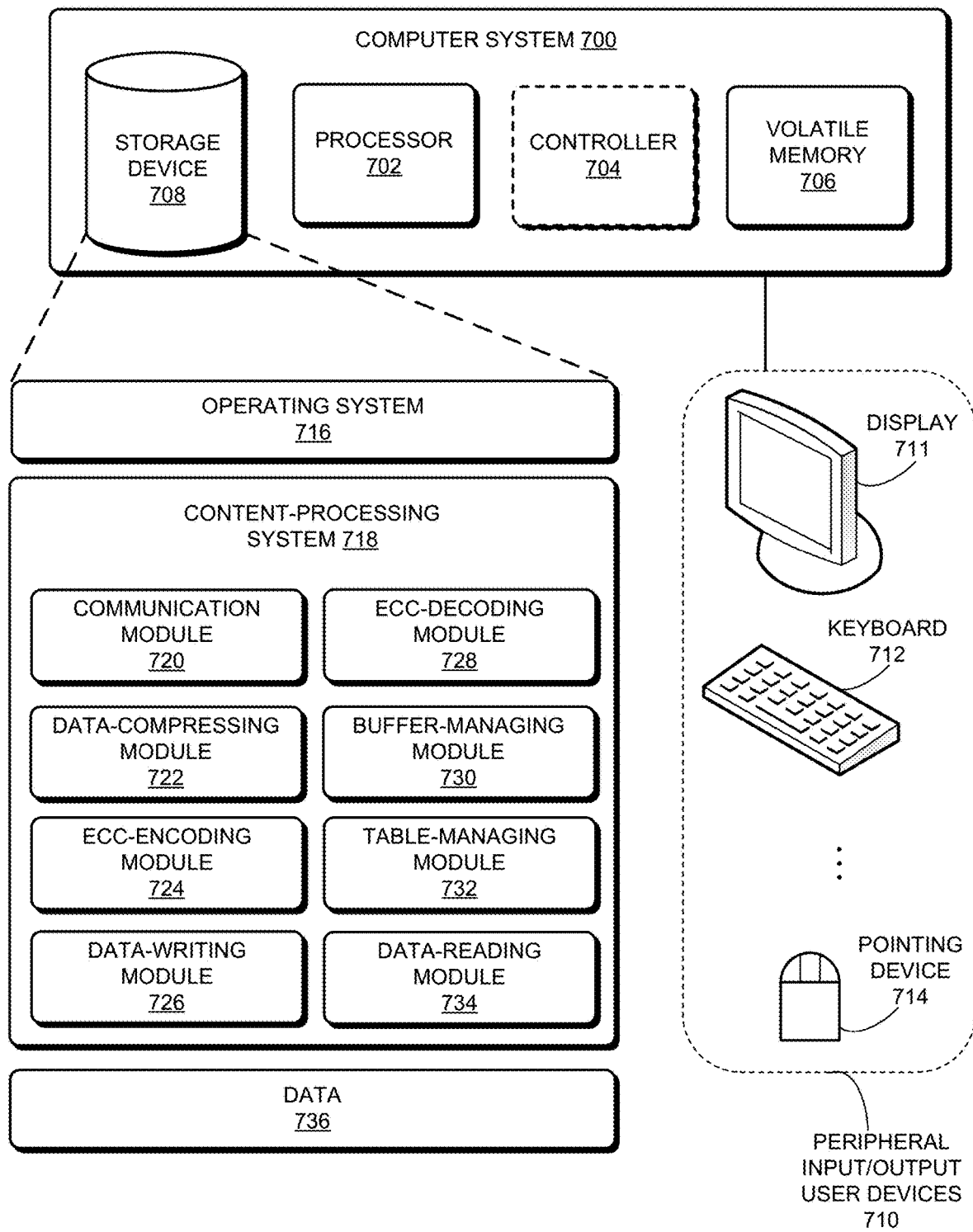
FIG. 7 illustrates an exemplary computer system that facilitates data compression and placement, in accordance with an embodiment of the present application.

FIG. 7 illustrates an exemplary computer system 700 that facilitates data compression and placement, in accordance with an embodiment of the present application. Computer system 700 includes a processor 702, a volatile memory 706, and a storage device 708. In some embodiments, computer system 700 can include a controller 704 (indicated by the dashed lines). Volatile memory 706 can include, e.g., random access memory (RAM), that serves as a managed memory, and can be used to store one or more memory pools. Storage device 708 can include persistent storage which can be managed or accessed via processor 702 (or controller 704). Furthermore, computer system 700 can be coupled to peripheral input/output (I/O) user devices 710, e.g., a display device 711, a keyboard 712, and a pointing device 714. Storage device 708 can store an operating system 716, a content-processing system 718, and data 736.

Content-processing system 718 can include instructions, which when executed by computer system 700, can cause computer system 700 or processor 702 to perform methods and/or processes described in this disclosure. Specifically, content-processing system 718 can include instructions for receiving and transmitting data packets, including data to be written or read, a data block, a compressed data block, an encoded data block, an LBA, and an input/output (I/O) request (e.g., a read request or a write request) (communication module 720).

Content-processing system 718 can further include instructions for receiving, by a storage device, a plurality of data blocks (communication module 720). Content-processing system 718 can include instructions for compressing the data blocks to obtain compressed data blocks (data-compressing module 722). Content-processing system 718 can include instructions for performing ECC-encoding on the compressed data blocks to obtain ECC-encoded data blocks (ECC-encoding module 724). Content-processing system 718 can include instructions for storing the ECC-encoded data blocks in a buffer prior to writing the ECC-encoded data blocks in a non-volatile memory of the storage device (data-writing module 726). Content-processing system 718 can include instructions for reorganizing an order of the ECC-encoded data blocks in the buffer to match a size of a physical page of the non-volatile memory (buffer-managing module 730). Content-processing system 718 can include instructions for, responsive to a first set of the reorganized ECC-encoded data blocks filling a first physical page (buffer-managing module 732), writing the first set of the reorganized ECC-encoded data blocks to the first physical page (data-writing module 726).

Content-processing system 718 can include instructions for receiving a request to read a data block in the first physical page from the non-volatile memory, wherein the requested data block comprises the respective obtained ECC-encoded data block written to the non-volatile memory (communication module 720). Content-processing system 718 can include instructions for determining, based on a logical block address (LBA) associated with the requested data block, a physical page address (PPA) at which the requested data block is stored by searching a data structure which stores a mapping between the LBA, the PPA, and an index for the requested data block (table-managing module 732). Content-processing system 718 can include instructions for retrieving the requested data block from the determined PPA based on the index (data-reading module 734). Content-processing system 718 can include instructions for performing ECC-decoding on the retrieved data block (ECC-decoding module 728). Content-processing system 718 can include instructions for returning the ECC-decoded data block to a requesting application (communication module 720).

Data 736 can include any data that is required as input or generated as output by the methods and/or processes described in this disclosure. Specifically, data 736 can store at least: data; a data block; a request; a read request; a write request; a logical block address (LBA); a physical block address (PBA); a physical page address (PPA); an index; a location or an offset; a data structure; a mapping table; compressed data; a compressed data block; encoded/decoded data; an encoded/decoded data block; ECC-encoded/decoded data; an ECC-encoded/decoded data block; an order of data blocks; a reorganized order; an indicator of a buffer; a set of reorganized ECC-encoded data blocks; data sufficient to fill a physical page; a header; a tail; a repeating pattern; a user portion; a shortened user portion; a parity portion; a punctured parity; a full parity check matrix; user-associated zeros; parity-associated zeros; a circulant; an all-zero square matrix; a non-zero square matrix; a full circulant; a partial or fractional circulant; a portion of an ECC codeword or a parity check matrix; and an indicator of whether a portion of data will join or bypass ECC-decoding.

Figure 8:
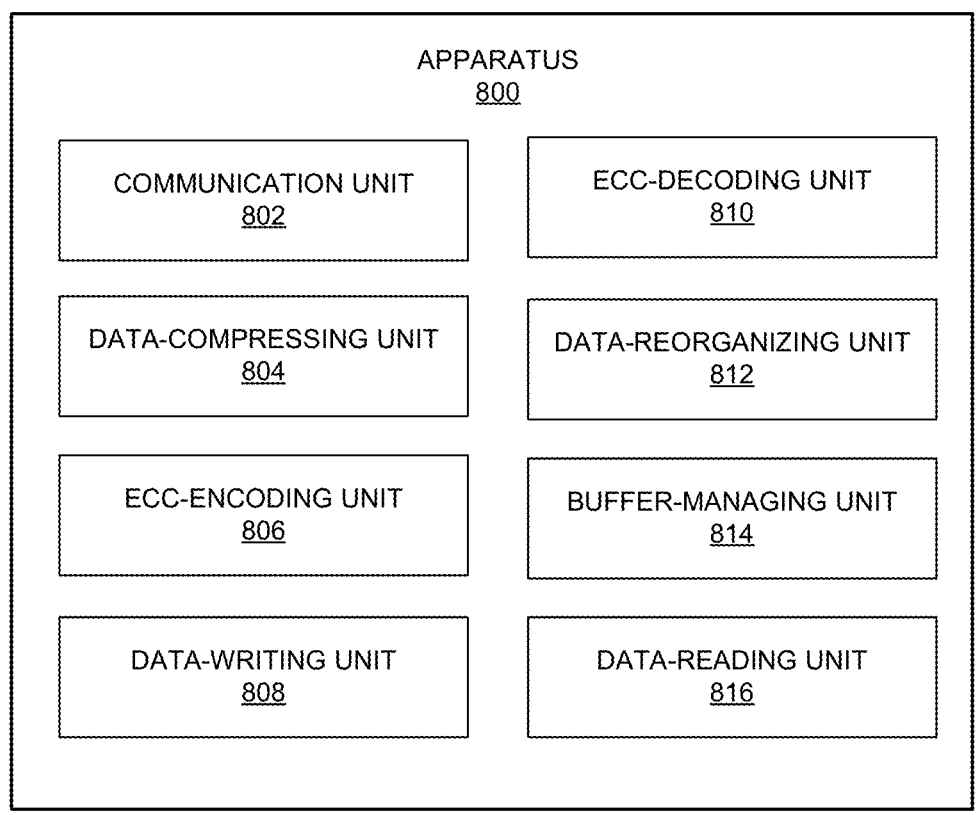
FIG. 8 illustrates an exemplary apparatus that facilitates data compression and placement, in accordance with an embodiment of the present application.

FIG. 8 illustrates an exemplary apparatus 800 that facilitates data compression and placement, in accordance with an embodiment of the present application. Apparatus 800 can comprise a plurality of units or apparatuses which may communicate with one another via a wired, wireless, quantum light, or electrical communication channel. Apparatus 800 may be realized using one or more integrated circuits, and may include fewer or more units or apparatuses than those shown in FIG. 8. Furthermore, apparatus 800 may be integrated in a computer system, or realized as a separate device or devices capable of communicating with other computer systems and/or devices.

Apparatus 800 can comprise modules or units 802-816 which are configured to perform functions or operations similar to modules 720-734 of computer system 700 of FIG. 7, including: a communication unit 802; a data-compressing unit 804; an ECC-encoding unit 806; a data-writing unit 808; an ECC-decoding unit 810; a data-reorganizing unit 812; a buffer-managing unit 814; and a data-reading unit 816.

The data structures and code described in this detailed description are typically stored on a computer-readable storage medium, which may be any device or medium that can store code and/or data for use by a computer system. The computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing computer-readable media now known or later developed.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium.

Furthermore, the methods and processes described above can be included in hardware modules. For example, the hardware modules can include, but are not limited to, application-specific integrated circuit (ASIC) chips, field-programmable gate arrays (FPGAs), and other programmable-logic devices now known or later developed. When the hardware modules are activated, the hardware modules perform the methods and processes included within the hardware modules.

The foregoing embodiments described herein have been presented for purposes of illustration and description only. They are not intended to be exhaustive or to limit the embodiments described herein to the forms disclosed. Accordingly, many modifications and variations will be apparent to practitioners skilled in the art. Additionally, the above disclosure is not intended to limit the embodiments described herein. The scope of the embodiments described herein is defined by the appended claims.

What is claimed is:

1. A computer-implemented method, comprising:
   receiving, by a storage device, a plurality of data blocks;
   compressing the data blocks to obtain compressed data blocks;
   performing error correction code (ECC)-encoding on the compressed data blocks to obtain ECC-encoded data blocks, wherein performing ECC-encoding on a respective compressed data block to obtain a respective ECC-encoded data block comprises:
      reducing a size of a user portion which corresponds to a full parity check matrix to obtain a shortened user portion which corresponds to a size of the respective compressed data block;
      performing ECC-encoding on the shortened user portion appended by zeros to obtain parity bits; and
      puncturing the parity bits to obtain a punctured parity, wherein the respective obtained ECC-encoded data block comprises the shortened user portion and the punctured parity;
   storing the ECC-encoded data blocks in a buffer prior to writing the ECC-encoded data blocks in a non-volatile memory of the storage device;
   reorganizing an order of the ECC-encoded data blocks in the buffer to match a size of a physical page of the non-volatile memory;
   responsive to a first set of the reorganized ECC-encoded data blocks filling a first physical page, writing the first set of the reorganized ECC-encoded data blocks to the first physical page;
   receiving a request to read a data block in the first physical page from the non-volatile memory, wherein the requested data block comprises the respective obtained ECC-encoded data block; and
   performing ECC-decoding on the requested data block, wherein a parity check matrix for the requested data block comprises a plurality of circulants,
   wherein a respective circulant comprises an all-zero square matrix or a non-zero square matrix,
   wherein a user portion of the parity check matrix corresponds to the shortened user portion of the requested data block appended with user-associated zeros,
   wherein a parity portion of the parity check matrix corresponds to the punctured parity of the requested data block appended with parity-associated zeros,
   wherein the user portion of the parity check matrix comprises one or more of:
      a first portion which includes full circulants and corresponds to the shortened user portion;
      a second portion which includes partial circulants and corresponds to both the shortened user portion and a first part of the appended user-associated zeros; and
      a third portion which includes full circulants and corresponds to a second part of the appended user-associated zeros; and
   wherein the parity portion of the parity check matrix comprises one or more of:
      a fourth portion which includes full circulants and corresponds to the punctured parity; and
      a fifth portion which includes full circulants and corresponds to the appended parity-associated zeros.

2. The method of claim 1, wherein the plurality of data blocks are associated with logical block addresses (LBAs), and wherein the method further comprises:
   storing, in a data structure, a mapping between:
      a logical block address (LBA) for a respective ECC-encoded data block;
      a physical page address in the first physical page at which the respective ECC-encoded data block is written; and
      an index which indicates a location or offset for the respective ECC-encoded data block in the first physical page.

3. The method of claim 2, wherein the first set of the reorganized ECC-encoded data blocks written to the first physical page comprises:
   a header prepended to a respective ECC-encoded data block; and
   a tail appended to the respective ECC-encoded data block,
   wherein the header and the tail comprise a repeated pattern which is based on the index for the respective ECC-encoded data block.

4. The method of claim 1, wherein the respective obtained ECC-encoded data block is written to the non-volatile memory as part of the first physical page, and wherein the method further comprises:
   determining, based on a logical block address (LBA) associated with the requested data block, a physical page address (PPA) at which the requested data block is stored by searching a data structure which stores a mapping between the LBA, the PPA, and an index for the requested data block;
   retrieving the requested data block from the determined PPA based on the index to obtain the requested data block;
   and
   subsequent to performing the ECC-decoding on the requested data block, returning the ECC-decoded data block to a requesting application.

5. The method of claim 1, wherein performing the ECC-decoding is based on:
the first portion;
the second portion and further based on a maximal confidence of the partial circulants which correspond to the second part of the appended user-associated zeroes;
the fourth portion; and
the fifth portion and further based on a minimal confidence of the full circulants which correspond to the appended parity-associated zeros.

6. The method of claim 5, wherein performing the ECC-decoding is further based on bypassing the third portion based on a maximal confidence of all-zero circulants comprising the third portion.

7. A computer system, comprising:
a processor; and
a memory coupled to the processor and storing instructions which, when executed by the processor, cause the processor to perform a method, the method comprising:
receiving, by a storage device, a plurality of data blocks;
compressing the data blocks to obtain compressed data blocks;
performing error correction code (ECC)-encoding on the compressed data blocks to obtain ECC-encoded data blocks, wherein performing ECC-encoding on a respective compressed data block to obtain a respective ECC-encoded data block comprises:
reducing a size of a user portion which corresponds to a full parity check matrix to obtain a shortened user portion which corresponds to a size of the respective compressed data block;
performing ECC-encoding on the shortened user portion appended by zeros to obtain parity bits; and
puncturing the parity bits to obtain a punctured parity, wherein the respective obtained ECC-encoded data block comprises the shortened user portion and the punctured parity;
storing the ECC-encoded data blocks in a buffer prior to writing the ECC-encoded data blocks in a non-volatile memory of the storage device;
reorganizing an order of the ECC-encoded data blocks in the buffer to match a size of a physical page of the non-volatile memory;
responsive to a first set of the reorganized ECC-encoded data blocks filling a first physical page, writing the first set of the reorganized ECC-encoded data blocks to the first physical page;
receiving a request to read a data block in the first physical page from the non-volatile memory, wherein the requested data block comprises the respective obtained ECC-encoded data block; and
performing ECC-decoding on the requested data block, wherein a parity check matrix for the requested data block comprises a plurality of circulants,
wherein a respective circulant comprises an all-zero square matrix or a non-zero square matrix,
wherein a user portion of the parity check matrix corresponds to the shortened user portion of the requested data block appended with user-associated zeros,
wherein a parity portion of the parity check matrix corresponds to the punctured parity of the requested data block appended with parity-associated zeros, wherein the user portion of the parity check matrix comprises one or more of:
a first portion which includes full circulants and corresponds to the shortened user portion;
a second portion which includes partial circulants and corresponds to both the shortened user portion and a first part of the appended user-associated zeros; and
a third portion which includes full circulants and corresponds to a second part of the appended user-associated zeros; and
wherein the parity portion of the parity check matrix comprises one or more of:
a fourth portion which includes full circulants and corresponds to the punctured parity; and
a fifth portion which includes full circulants and corresponds to the appended parity-associated zeros.

8. The computer system of claim 7, wherein the plurality of data blocks are associated with logical block addresses (LBAs), and wherein the method further comprises:
storing, in a data structure, a mapping between:
a logical block address (LBA) for a respective ECC-encoded data block;
a physical page address in the first physical page at which the respective ECC-encoded data block is written; and
an index which indicates a location or offset for the respective ECC-encoded data block in the first physical page.

9. The computer system of claim 8, wherein the first set of the reorganized ECC-encoded data blocks written to the first physical page comprises:
a header prepended to a respective ECC-encoded data block; and
a tail appended to the respective ECC-encoded data block,
wherein the header and the tail comprise a repeated pattern which is based on the index for the respective ECC-encoded data block.

10. The computer system of claim 7, wherein the respective obtained ECC-encoded data block is written to the non-volatile memory as part of the first physical page, and wherein the method further comprises:
determining, based on a logical block address (LBA) associated with the requested data block, a physical page address (PPA) at which the requested data block is stored by searching a data structure which stores a mapping between the LBA, the PPA, and an index for the requested data block;
retrieving the requested data block from the determined PPA based on the index to obtain the requested data block;
and
subsequent to performing the ECC-decoding on the requested data block, returning the ECC-decoded data block to a requesting application.

11. The computer system of claim 7, wherein performing the ECC-decoding is based on:
the first portion;
the second portion and further based on a maximal confidence of the partial circulants which correspond to the second part of the appended user-associated zeroes;
the fourth portion; and
the fifth portion and further based on a minimal confidence of the full circulants which correspond to the appended parity-associated zeros.

12. The computer system of claim 11, wherein performing the ECC-decoding is further based on bypassing the third portion based on a maximal confidence of all-zero circulants comprising the third portion.

13. A non-transitory computer-readable storage medium storing instructions that when executed by a computer cause the computer to perform a method, the method comprising:
receiving, by a storage device, a plurality of data blocks;
compressing the data blocks to obtain compressed data blocks;
performing error correction code (ECC)-encoding on the compressed data blocks to obtain ECC-encoded data blocks, wherein performing ECC-encoding on a respective compressed data block to obtain a respective ECC-encoded data block comprises:
reducing a size of a user portion which corresponds to a full parity check matrix to obtain a shortened user portion which corresponds to a size of the respective compressed data block;
performing ECC-encoding on the shortened user portion appended by zeros to obtain parity bits; and
puncturing the parity bits to obtain a punctured parity, wherein the respective obtained ECC-encoded data block comprises the shortened user portion and the punctured parity;
storing the ECC-encoded data blocks in a buffer prior to writing the ECC-encoded data blocks in a non-volatile memory of the storage device;
reorganizing an order of the ECC-encoded data blocks in the buffer to match a size of a physical page of the non-volatile memory;
responsive to a first set of the reorganized ECC-encoded data blocks filling a first physical page, writing the first set of the reorganized ECC-encoded data blocks to the first physical page;
receiving a request to read a data block in the first physical page from the non-volatile memory, wherein the requested data block comprises the respective obtained ECC-encoded data block; and
performing ECC-decoding on the requested data block, wherein a parity check matrix for the requested data block comprises a plurality of circulants,
wherein a respective circulant comprises an all-zero square matrix or a non-zero square matrix,
wherein a user portion of the parity check matrix corresponds to the shortened user portion of the requested data block appended with user-associated zeros,
wherein a parity portion of the parity check matrix corresponds to the punctured parity of the requested data block appended with parity-associated zeros,
wherein the user portion of the parity check matrix comprises one or more of:
a first portion which includes full circulants and corresponds to the shortened user portion;
a second portion which includes partial circulants and corresponds to both the shortened user portion and a first part of the appended user-associated zeros; and
a third portion which includes full circulants and corresponds to a second part of the appended user-associated zeros; and
wherein the parity portion of the parity check matrix comprises one or more of:
a fourth portion which includes full circulants and corresponds to the punctured parity; and
a fifth portion which includes full circulants and corresponds to the appended parity-associated zeros.

14. The storage medium of claim 13, wherein the respective obtained ECC-encoded data block is written to the non-volatile memory as part of the first physical page, and wherein the method further comprises:
determining, based on a logical block address (LBA) associated with the requested data block, a physical page address (PPA) at which the requested data block is stored by searching a data structure which stores a mapping between the LBA, the PPA, and an index for the requested data block;
retrieving the requested data block from the determined PPA based on the index to obtain the requested data block;
and
subsequent to performing the ECC-decoding on the requested data block, returning the ECC-decoded data block to a requesting application.

15. The storage medium of claim 13,
wherein performing the ECC-decoding is based on:
the first portion;
the second portion and further based on a maximal confidence of the partial circulants which correspond to the second part of the appended user-associated zeroes;
the fourth portion; and
the fifth portion and further based on a minimal confidence of the full circulants which correspond to the appended parity-associated zeros; and
wherein performing the ECC-decoding is further based on bypassing the third portion based on a maximal confidence of all-zero circulants comprising the third portion.

* * * * *